United States Patent
Baker

(10) Patent No.: US 8,042,012 B2
(45) Date of Patent: *Oct. 18, 2011

(54) SYSTEMS AND DEVICES INCLUDING MEMORY WITH BUILT-IN SELF TEST AND METHODS OF MAKING AND USING THE SAME

(75) Inventor: R. Jacob Baker, Boise, ID (US)

(73) Assignee: Micron Technology, Inc., Bosie, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/903,936

(22) Filed: Oct. 13, 2010

(65) Prior Publication Data

US 2011/0035637 A1    Feb. 10, 2011

Related U.S. Application Data

(63) Continuation of application No. 11/818,926, filed on Jun. 15, 2007, now Pat. No. 7,818,638.

(51) Int. Cl.
*G11C 29/00*    (2006.01)

(52) U.S. Cl. ............ 714/718; 714/719; 714/25; 714/30; 714/42; 714/54; 714/733; 714/734; 714/736; 714/742; 341/143; 341/144; 365/185.23; 365/201; 365/185.21

(58) Field of Classification Search .................. None
See application file for complete search history.

(56) References Cited

U.S. PATENT DOCUMENTS

| | | | |
|---|---|---|---|
| 5,600,319 | A | 2/1997 | Ginetti |
| 5,614,856 | A | 3/1997 | Wilson et al. |
| 5,953,276 | A | 9/1999 | Baker |
| 6,044,019 | A | 3/2000 | Cernea et al. |
| 6,188,340 | B1 | 2/2001 | Matsumoto et al. |
| 6,282,120 | B1 | 8/2001 | Cernea et al. |
| 6,490,200 | B2 | 12/2002 | Cernea et al. |
| 6,504,750 | B1 | 1/2003 | Baker |
| 6,567,297 | B2 | 5/2003 | Baker |
| 6,661,708 | B2 | 12/2003 | Cernea et al. |
| 6,664,708 | B2 | 12/2003 | Shlimak et al. |
| 6,741,502 | B1 | 5/2004 | Cernea |
| 6,769,081 | B1 * | 7/2004 | Parulkar ........................ 714/733 |
| 6,781,906 | B2 | 8/2004 | Perner et al. |
| 6,785,156 | B2 | 8/2004 | Baker |
| 6,795,359 | B1 | 9/2004 | Baker |

(Continued)

OTHER PUBLICATIONS

Rane Corporation, RaneNote 137, "Digital Charma of Audio A/D Converters," 1997, 12 pgs.

(Continued)

*Primary Examiner* — John Trimmings
(74) *Attorney, Agent, or Firm* — Fletcher Yoder

(57) ABSTRACT

Disclosed are methods, systems and devices, such as a device including a data location, a quantizing circuit coupled to the data location, and a test module coupled to the quantizing circuit. The quantizing circuit may include an analog-to-digital converter, a switch coupled to the memory element and a feedback signal path coupled to the output of the analog-to-digital converter and to the switch.

33 Claims, 16 Drawing Sheets

U.S. PATENT DOCUMENTS

| | | |
|---|---|---|
| 6,798,705 B2 | 9/2004 | Baker |
| 6,813,208 B2 | 11/2004 | Baker |
| 6,822,892 B2 | 11/2004 | Baker |
| 6,826,102 B2 | 11/2004 | Baker |
| 6,829,188 B2 | 12/2004 | Baker |
| 6,847,234 B2 | 1/2005 | Choi |
| 6,850,441 B2 | 2/2005 | Mokhlesi et al. |
| 6,856,564 B2 | 2/2005 | Baker |
| 6,870,784 B2 | 3/2005 | Baker |
| 6,901,020 B2 * | 5/2005 | Baker ............ 365/209 |
| 6,914,838 B2 | 7/2005 | Baker |
| 6,930,942 B2 * | 8/2005 | Baker ............ 365/209 |
| 6,954,390 B2 | 10/2005 | Baker |
| 6,954,391 B2 | 10/2005 | Baker |
| 6,985,375 B2 | 1/2006 | Baker |
| 7,002,833 B2 | 2/2006 | Hush et al. |
| 7,009,901 B2 | 3/2006 | Baker |
| 7,068,206 B2 * | 6/2006 | Augusto et al. ............ 341/172 |
| 7,095,667 B2 | 8/2006 | Baker |
| 7,102,932 B2 | 9/2006 | Baker |
| 7,133,307 B2 | 11/2006 | Baker |
| 7,362,610 B1 * | 4/2008 | Salter et al. ............ 365/185.02 |
| 7,372,717 B2 * | 5/2008 | Baker ............ 365/148 |
| 7,508,725 B2 * | 3/2009 | Sugiura et al. ............ 365/201 |
| 7,672,803 B1 * | 3/2010 | Lee et al. ............ 702/117 |
| 2002/0101758 A1 | 8/2002 | Baker |
| 2002/0194557 A1 * | 12/2002 | Park ............ 714/718 |
| 2003/0039162 A1 | 2/2003 | Baker |
| 2003/0043616 A1 | 3/2003 | Baker |
| 2003/0067797 A1 | 4/2003 | Baker |
| 2003/0198078 A1 | 10/2003 | Baker |
| 2003/0214868 A1 | 11/2003 | Baker |
| 2004/0008555 A1 | 1/2004 | Baker |
| 2004/0032760 A1 | 2/2004 | Baker |
| 2004/0062100 A1 | 4/2004 | Baker |
| 2004/0076052 A1 | 4/2004 | Baker |
| 2004/0095839 A1 | 5/2004 | Baker |
| 2004/0190327 A1 | 9/2004 | Baker |
| 2004/0190334 A1 | 9/2004 | Baker |
| 2004/0199710 A1 | 10/2004 | Baker |
| 2004/0240294 A1 | 12/2004 | Baker |
| 2005/0002249 A1 | 1/2005 | Baker |
| 2005/0007803 A1 | 1/2005 | Baker |
| 2005/0007850 A1 | 1/2005 | Baker |
| 2005/0013184 A1 | 1/2005 | Baker |
| 2005/0018477 A1 | 1/2005 | Baker |
| 2005/0018512 A1 * | 1/2005 | Baker ............ 365/209 |
| 2005/0041128 A1 | 2/2005 | Baker |
| 2005/0088892 A1 | 4/2005 | Baker |
| 2005/0088893 A1 | 4/2005 | Baker |
| 2005/0201145 A1 | 9/2005 | Baker |
| 2006/0013040 A1 * | 1/2006 | Baker ............ 365/171 |
| 2006/0062062 A1 | 3/2006 | Baker |
| 2006/0227641 A1 | 10/2006 | Baker |
| 2006/0250853 A1 | 11/2006 | Taylor et al. |

OTHER PUBLICATIONS

Baker, R.J., (2001-2006) *Sensing Circuits for Resistive Memory*, presented at various universities and companies.

Baker, "*CMOS Mixed Signal Circuit Design*," IEEE Press, A. John Wiley & Sons, Inc.; Copyright 2003, Figures 30.63, 31.82, 32.6, 32.7, 32.24, 32.51, 33.34, 33.47, 33.51, 34.18, 34.24; located at http://cmosedu.com/cmos2/book2.htm.

Dallas Semiconductor, Maxim Application Note 1870, "*Demystifying Sigma-Delta ADCs*," (Jan. 31, 2003), 15 pgs.

Baker, R.J., (2003) *Mixed-Signal Design in the Microelectronics Curriculum*, IEEE University/Government/Industry Microelectronics (UGIM) Symposium, Jun. 30-Jul. 2, 2003.

Baker, R.J. (2004) *Delta-Sigma Modulation for Sensing, IEEE/EDS Workshop on Microelectronics and Electron Devices (WMED)*, Apr. 2004.

Baker, "*CMOS Circuit Design, Layout, and Simulation*," Second Edition, IEEE Press, A. John Wiley & Sons, Inc.; Copyright 2005; Chapters 13, 16, 17, 20, 22-24, 28-29; pp. 375-396, 433-522, 613-656, 711-828, 931-1022.

Hadrick, M. and Baker, R.J., (2005) *Sensing in CMOS Imagers using Delta-Sigma Modulation*, a general presentation of our work in this area.

Baker, R.J. (2005) *Design of High-Speed CMOS Op-Amps for Signal Processing, IEEE/EDS Workshop on Microelectronics and Electron Devices (WMED)*, Apr. 2005.

Leslie, M.B., and Baker, R.J., (2006) "*Noise-Shaping Sense Amplifier for MRAM Cross-Point Arrays*," *IEEE Journal of Solid State Circuits*, vol. 41, No. 3, pp. 699-704.

Duvvada, K., Saxena, V., and Baker, R. J., (2006) *High Speed Digital Input Buffer Circuits*, proceedings of the IEEE/EDS Workshop on Microelectronics and Electron Devices (WMED), pp. 11-12, Apr. 2006.

Saxena, V., Plum, T.J., Jessing, J.R., and Baker, R. J., (2006) *Design and Fabrication of a MEMS Capacitive Chemical Sensor System*, proceedings of the IEEE/EDS Workshop on Microelectronics and Electron Devices (WMED), pp. 17-18, Apr. 2006.

Baker, R.J. and Saxena, V., (2007) *Design of Bandpass Delta Sigma Modulators: Avoiding Common Mistakes*, presented at various universities and companies.

Wikipedia—definition of "Error detection and correction", pulled from website Jun. 1, 2007, 9 pgs.

Wikipedia—definition of "Hamming code", pulled from website Jun. 1, 2007, 8 pgs.

Wikipedia—definition of "Linear feedback shift register (LFSR)," pulled from website Jun. 1, 2007, 4 pgs.

Park, "*Motorola Digital Signal Processors—Principles of Sigma-Delta Modulation for Analog-to-Digital Converters*," (Undated).

* cited by examiner

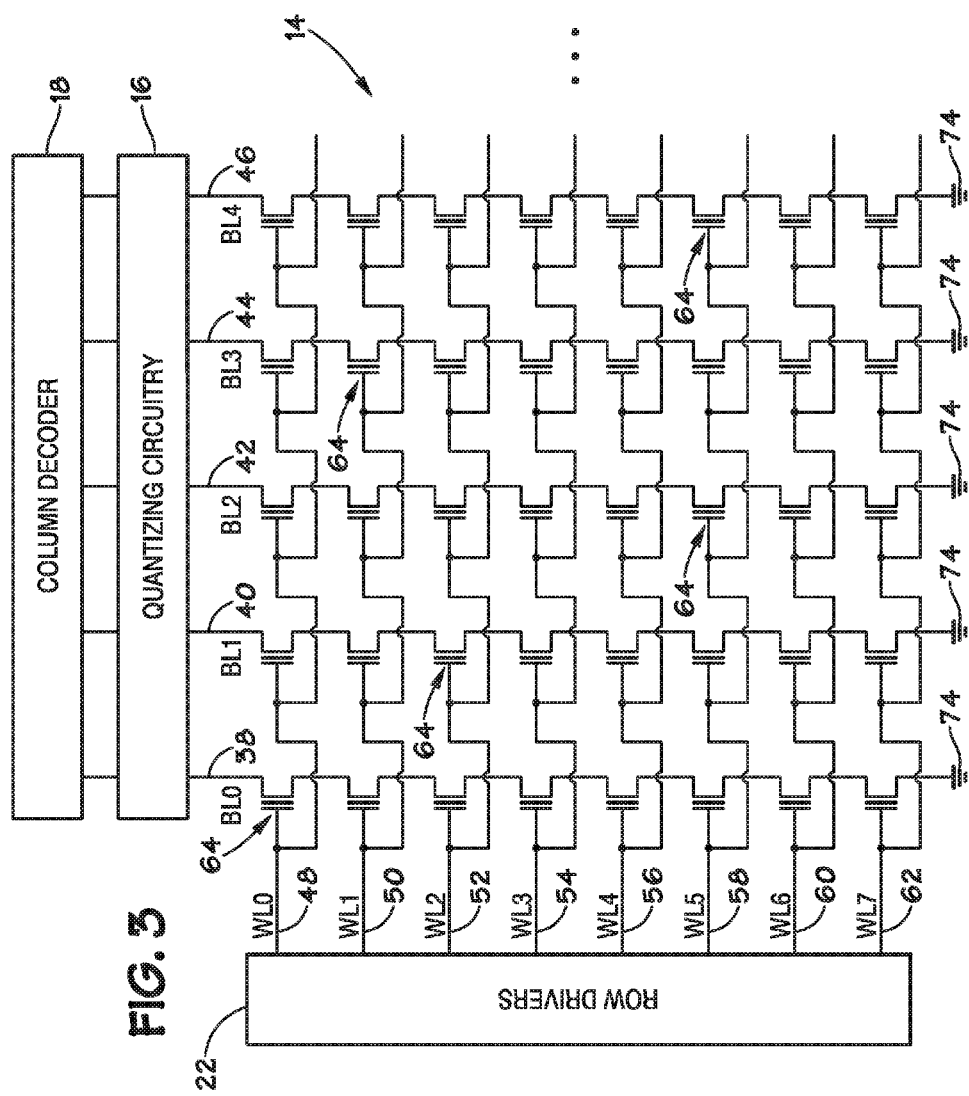

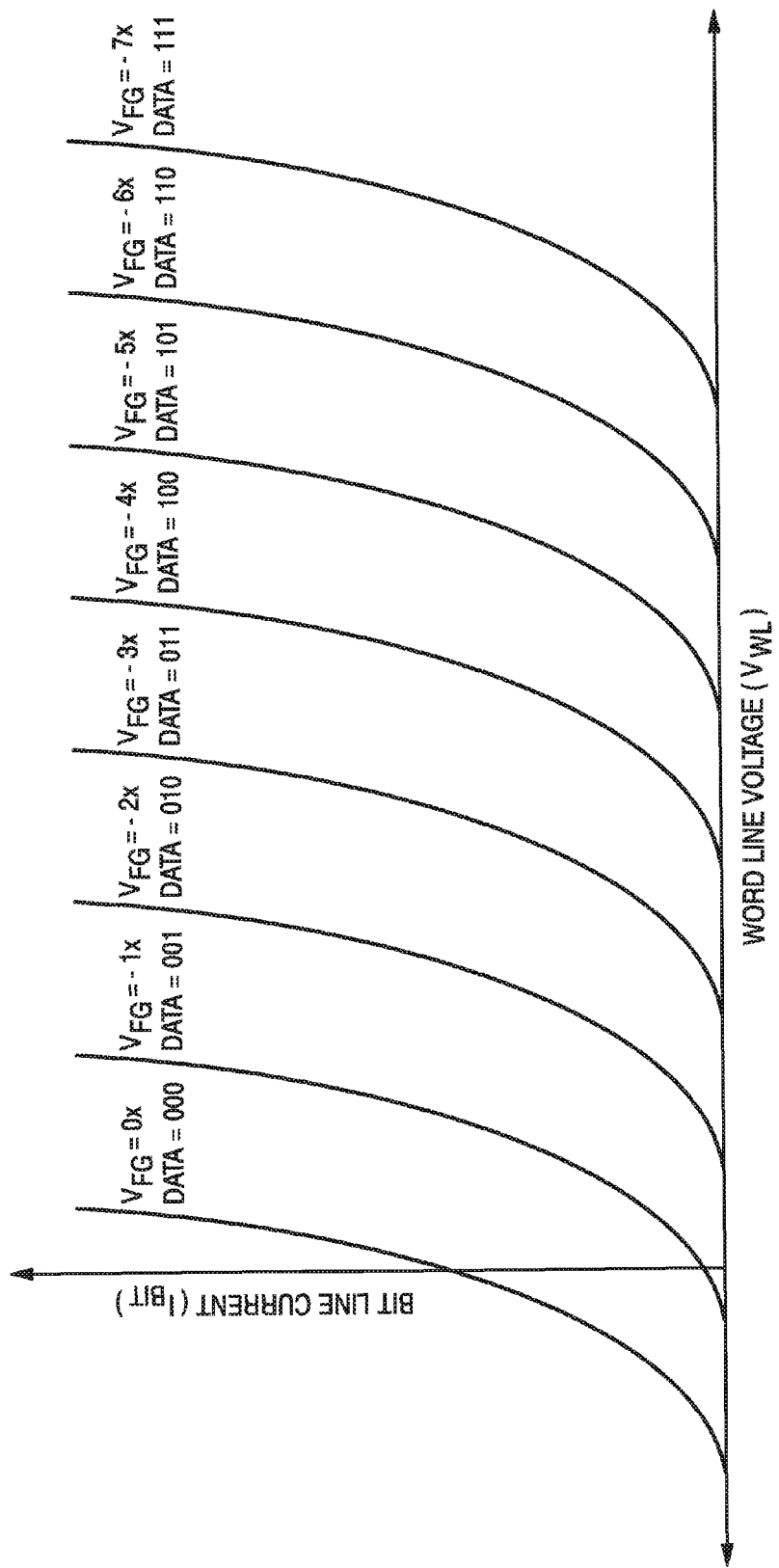

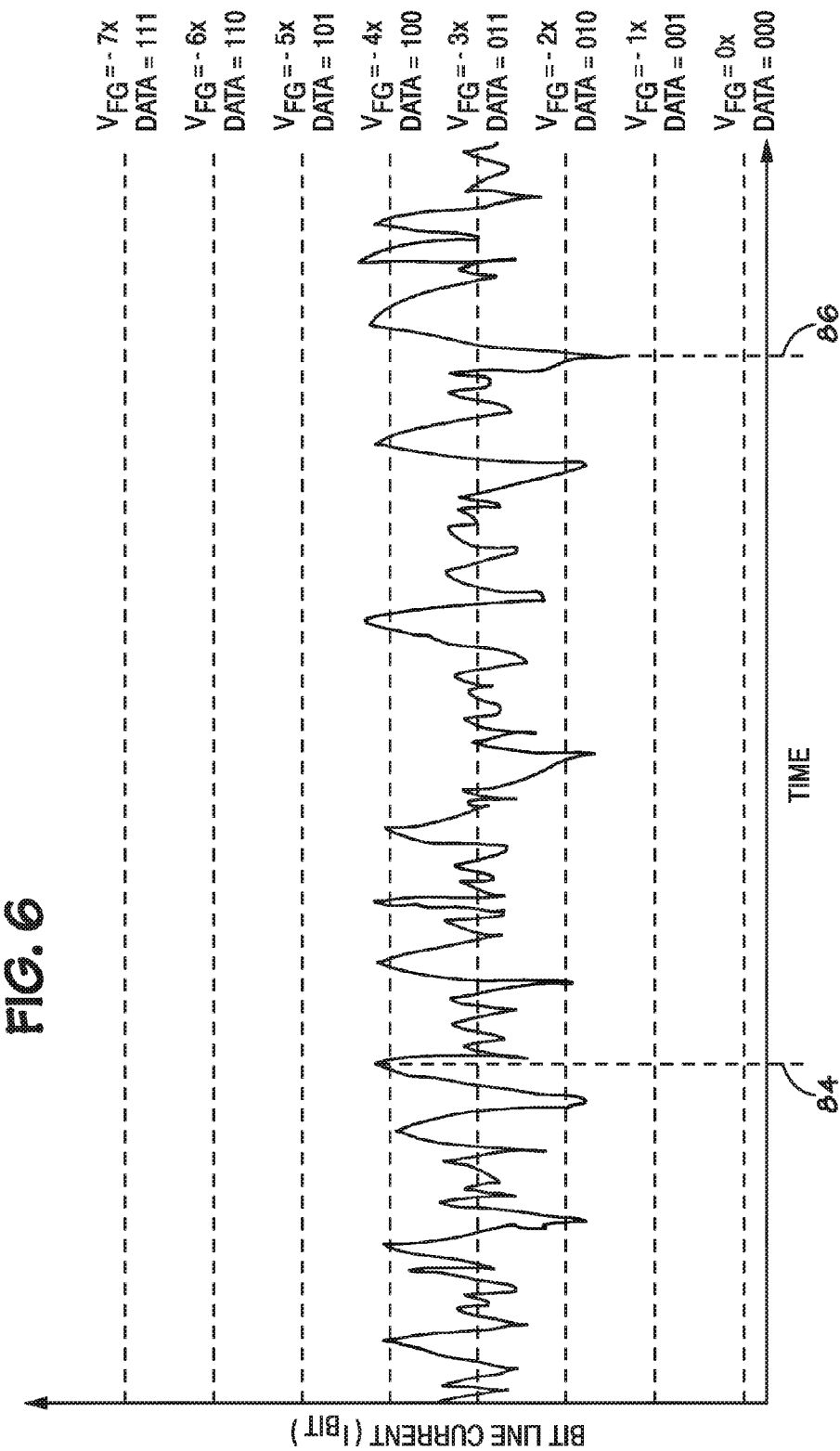

SYSTEMS AND DEVICES INCLUDING MEMORY WITH BUILT-IN SELF TEST AND METHODS OF MAKING AND USING THE SAME

CROSS-REFERENCE TO RELATED APPLICATION

This application is a continuation of U.S. patent application Ser. No. 11/818,926, which was filed on Jun. 15, 2007, now U.S. Pat. No. 7,818,638, which issued on Oct. 19, 2010.

BACKGROUND

1. Field of Invention

Embodiments of the present invention relate generally to electronic devices and, more specifically, in certain embodiments, to memory with built-in self test.

2. Description of Related Art

Generally, memory devices include an array of memory elements and associated sense amplifiers. The memory elements store data, and the sense amplifiers read the data from the memory elements. To read data, for example, a current is passed through the memory element, and the current or a resulting voltage is measured by the sense amplifier. Conventionally, the sense amplifier measures the current or voltage by comparing it to a reference current or voltage. Depending on whether the current or voltage is greater than the reference, the sense amplifier outputs a value of one or zero. That is, the sense amplifier quantizes (e.g., digitizes) the analog signal from the memory element into one of two logic states.

Many types of memory elements are capable of assuming more than just two states. For example, some memory elements are capable of multi-bit (e.g., more than two state) storage. For instance, rather than outputting either a high or low voltage, the memory element may output four or eight different voltage levels, each level corresponding to a different data value. However, conventional sense amplifiers often fail to distinguish accurately between the additional levels because the difference between the levels (e.g., a voltage difference) in a multi-bit memory element is often smaller than the difference between the levels in a single-bit (i.e., two state) memory element. Thus, conventional sense amplifiers often cannot read multi-bit memory elements. This problem may be increased as high performance multi-bit memory elements become increasingly dense, thereby reducing the size of the memory elements and the difference between the levels (e.g., voltage) to be sensed by the sense amplifiers.

A variety of factors may tend to prevent the sense amplifier from discerning small differences in the levels of a multi-bit memory element. For instance, noise in the power supply, ground, and reference voltage may cause an inaccurate reading of the memory element. The noise may have a variety of sources, such as temperature variations, parasitic signals, data dependent effects, and manufacturing process variations. This susceptibility to noise often leads a designer to reduce the number of readable states of the memory element, which tends to reduce memory density and increase the cost of memory.

In addition to problems with discerning differences in the levels of multi-bit memory elements, these memory elements are often difficult to test. The additional bits stored by a multi-bit memory element may cause the multi-bit memory element to take more time to test than some single-bit memory elements. This extra test time may delay the manufacture or use of multi-bit memory elements and add to their cost.

BRIEF DESCRIPTION OF DRAWINGS

FIG. 3 illustrates a memory array in accordance with an embodiment of the invention;

FIG. 5 illustrates I-V traces of memory elements storing different values, in accordance with an embodiment of the invention;

FIG. 6 illustrates noise in the bit-line current during a read operation;

DETAILED DESCRIPTION OF SPECIFIC EMBODIMENTS

Various embodiments of the present invention are described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

Some of the subsequently described embodiments may address one or more of the problems with conventional sense amplifiers discussed above. Some embodiments include a quantizing circuit configured to detect small differences in voltages and/or currents. As explained below, the quantizing circuit may sample the measured electrical parameter on multiple occasions and filter, e.g., average or sum, the samples to reduce the impact of noise. As a result, in some embodiments, the quantizing circuit may resolve small differences between voltage or current levels in multi-bit memory elements and/or light sensors, which may allow circuit designers to increase the number of bits stored per memory element and/or the sensitivity of an imaging device.

Certain embodiments described below may include a built-in, self-test module that may mitigate certain problems with testing memory devices, including single-bit and multi-bit memory devices. As explained below, some embodiments of the built-in, self-test module output test data that is written to a data location and, later, determine whether the data location stored the test data.

Figure 1:
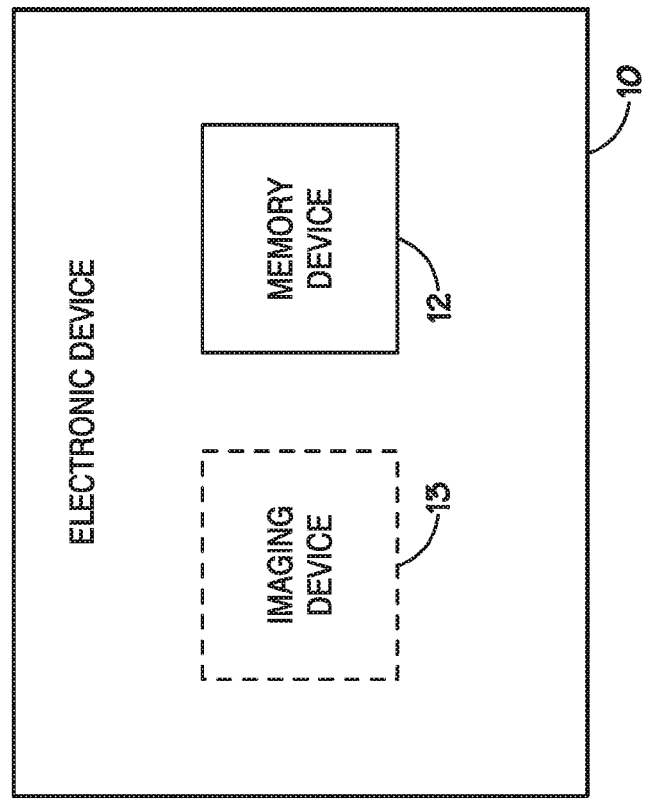
FIG. 1 illustrates an electronic device in accordance with an embodiment of the invention.

FIG. 1 depicts an electronic device 10 that may be fabricated and configured in accordance with one or more of the present embodiments. The illustrated electronic device 10 includes a memory device 12 that, as explained further below, may include multi-bit memory elements and quantizing circuits. Alternatively, or additionally, the electronic device 10 may include an imaging device 13 having the quantizing circuits.

Myriad devices may embody one or more of the present techniques. For example, the electronic device 10 may be a storage device, a communications device, an entertainment device, an imaging system, or a computer system, such as a personal computer, a server, a mainframe, a tablet computer, a palm-top computer, or a laptop.

Figure 2:
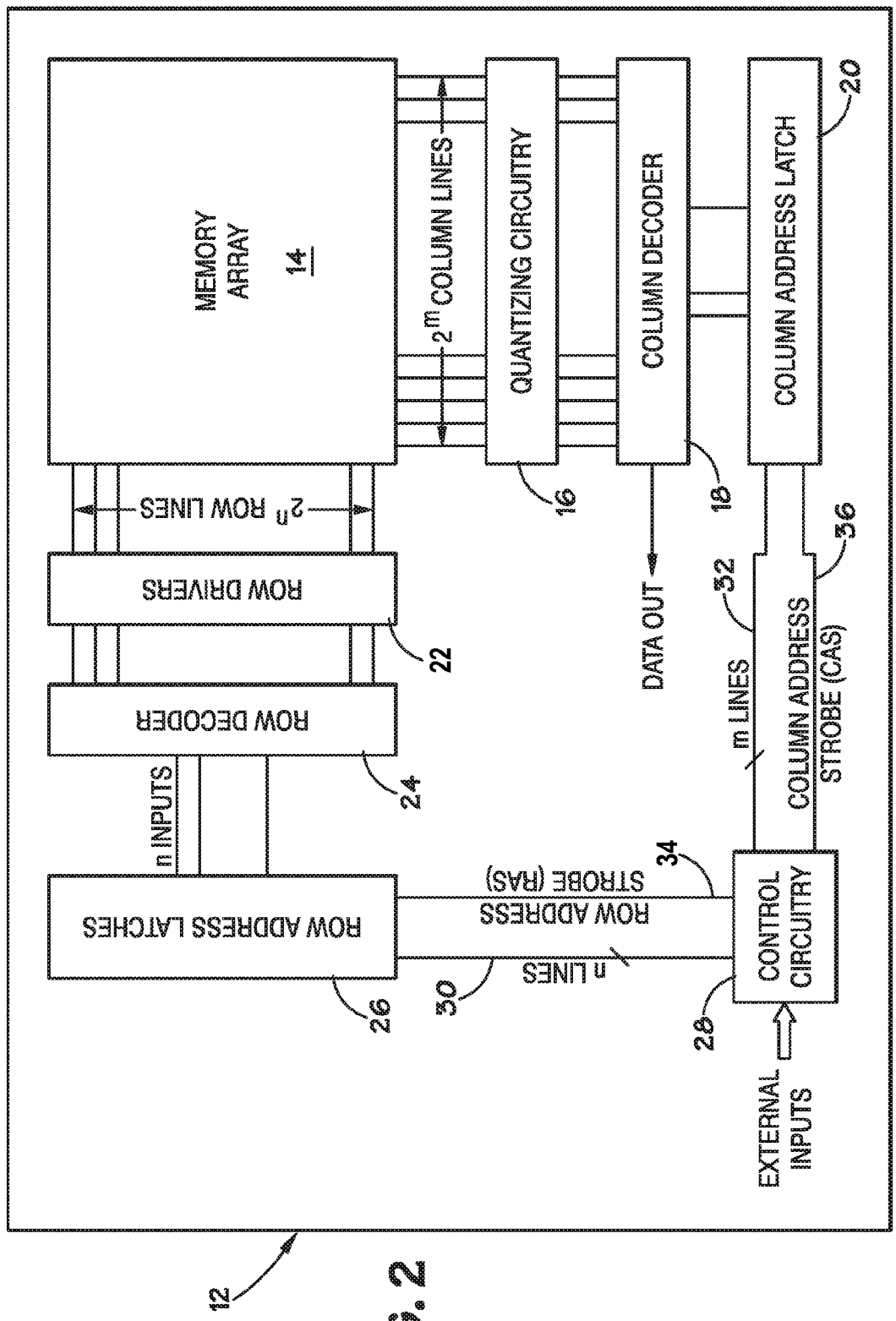
FIG. 2 illustrates a memory device in accordance with an embodiment of the invention.

FIG. 2 depicts a block diagram of an embodiment of the memory device 12. The illustrated memory device 12 may include a memory array 14, a quantizing circuit 16, a column decoder 18, a column address latch 20, row drivers 22, a row decoder 24, row address latches 26, and control circuitry 28. As described below with reference to FIG. 3, the memory array 14 may include a matrix of memory elements arranged in rows and columns. As will be appreciated, the imaging device 13 (FIG. 1) may include similar features except that in the case of an imaging device 13, the array 14 might comprise an array of imaging elements, such as complementary-metal-oxide semiconductor (CMOS) imaging elements or charge coupled devices (CCDs).

When accessing the memory elements, the control circuitry may receive a command to read from or write to a target memory address. The control circuitry 28 may then convert the target address into a row address and a column address. In the illustrated embodiment, the row address bus 30 transmits the row address to the row address latches 26, and a column address bus 32 transmits column address to the column address latches 20. After an appropriate settling time, a row address strobe (RAS) signal 34 (or other controlling clock signal) may be asserted by the control circuitry 28, and the row address latches 26 may latch the transmitted row address. Similarly, the control circuitry 28 may assert a column address strobe 36, and the column address latches 20 may latch the transmitted column address.

Once row and column addresses are latched, the row decoder 24 may determine which row of the memory array 14 corresponds to the latched row address, and the row drivers 22 may assert a signal on the selected row. Similarly, the column decoder 18 may determine which column of the memory array 14 corresponds to the latched column address, and the quantizing circuit 16 may quantize (e.g., sense) a voltage or current on the selected column. Additional details of reading and writing are described below.

FIG. 3 illustrates an example of a memory array 14. The illustrated memory array 14 includes a plurality of bit-lines 38, 40, 42, 44, and 46 (also referred to as BL0-BL4) and a plurality of word-lines 48, 50, 52, 54, 56, 58, 60, and 62 (also referred to as WL0-WL7). These bit-lines and word-lines are examples of electrical conductors. The memory array 14 further includes a plurality of memory elements 64, each of which may be arranged to intersect one of the bit-lines and one of the word-lines. In other embodiments, imaging elements may be disposed at each of these intersections.

The memory elements and imaging elements may be referred to generally as data locations, i.e., devices or elements configured to convey data, either stored or generated by a sensor, when sensed by a sensing circuit, such as the quantizing circuits discussed below. The data locations may be formed on an integrated semiconductor device (e.g., a device formed on a single crystal of silicon) that also includes the other components of the memory device 12 (or imaging device 13).

In some embodiments, the illustrated memory elements 64 are flash memory devices. The operation of the flash memory elements is described further below with reference to the FIGS. 4 and 5. It should be noted that, in other embodiments, the memory elements 64 may include other types of volatile or nonvolatile memory. For example, the memory elements 64 may include a resistive memory, such as a phase change memory or magnetoresistive memory. In another example, the memory elements 64 may include a capacitor, such as a stacked or trench capacitor. Some types of memory elements 64 may include an access device, such as a transistor or a diode associated with each of the memory elements 64, or the memory elements 64 may not include an access device, for instance in a cross-point array.

Figure 4:
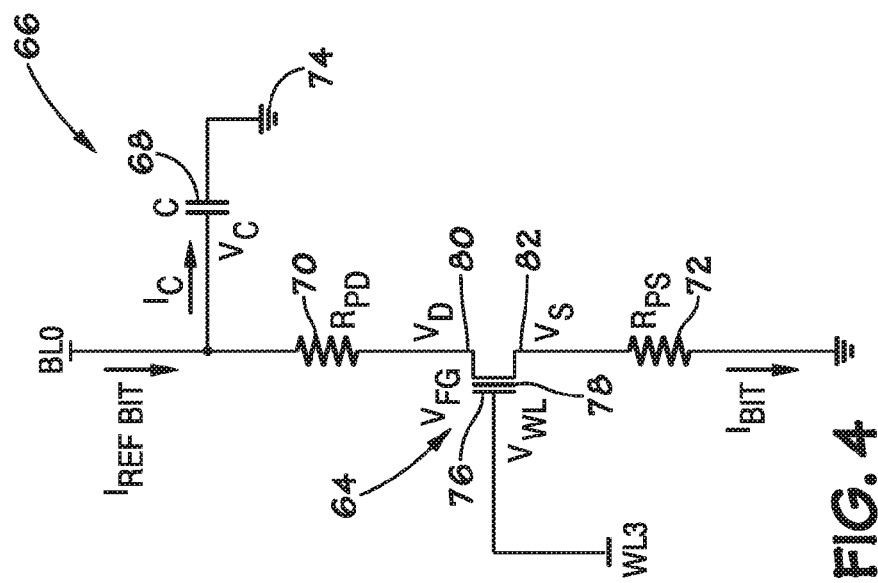
FIG. 4 illustrates a memory element in accordance with an embodiment of the invention.

FIG. 4 illustrates a circuit 66 that models the operation of an arbitrarily selected memory element 64, which is disposed at the intersection of WL3 and BL0. This circuit 66 includes a capacitor 68, a pre-drain resistor 70 ($R_{PD}$), a post-source resistor 72 ($R_{PS}$), and a ground 74. The resistors 70 and 72 model the other devices in series with the memory element 64 being sensed. The illustrated memory element 64 includes a gate 76, a floating gate 78, a drain 80, and a source 82. In the circuit 66, the drain 80 and source 82 are disposed in series between the pre-drain resistor 70 and the post-source resistor 72. The gate 76 is connected to WL3. The pre-drain resistor 70, the drain 80, the source 82, and the post-source resistor 72 are disposed in series on the bit-line BL0. The capacitor 68, which models the capacitance of the bit-line, has one plate connected to ground 74 and another plate connected to the bit-line BL0, in parallel with the memory elements 64.

Several of the components of the circuit 66 represent phenomenon affecting the memory elements 64 when it is sensed. The pre-drain resistor 70 generally represents the drain-to-bitline resistance of the memory elements 64 connected to the bit-line above (i.e., up current from) WL3 when these memory elements 64 are turned on, (e.g., during a read operation). Similarly, the post source resistor 72 generally corresponds to the source-to-ground resistance of the memory elements 64 connected to the bit-line below WL3 when the memory element 64 is sensed. The circuit 66 models electrical phenomena associated with reading the memory elements 64 at the intersection of WL3 and BL0.

The operation of the memory elements 64 will now be briefly described with reference to FIGS. 4 and 5. FIG. 5 illustrates one potential relationship between the bit-line current ($I_{BIT}$), the word-line voltage ($V_{WL}$), and the voltage of the floating gate 78 ($V_{FG}$). As illustrated by FIG. 5, $V_{FG}$ affects the response of the memory element 64 to a given $V_{WL}$. Decreasing the voltage of the floating gate shifts the I-V curve of the memory elements 64 to the right. That is, the relationship between the bit-line current and a word-line voltage depends on the voltage of the floating gate 78. The memory elements 64 may store data by exploiting this effect.

To write data to the memory elements 64, a charge corresponding to the data may be stored on the floating gate 78. The charge of the floating gate 78 may be modified by applying voltages to the source 82, drain 80, and/or gate 76 such that the resulting electric fields produce phenomenon like Fowler-Northam tunneling and/or hot-electron injection near the floating gate 78. Initially, the memory elements 64 may be erased by applying a word-line voltage designed to drive electrons off of the floating gate 78. In some embodiments, an entire column or block of memory elements 64 may be erased generally simultaneously. Once the memory elements 64 are erased, the gate 76 voltage may be manipulated to drive a charge onto the floating gate 78 that is indicative of a data value. After the write operation ends, the stored charge may remain on the floating gate 78 (i.e., the memory elements 64 may store data in a nonvolatile fashion).

As illustrated by FIG. 5, the value stored by the memory element 64 may be read by applying a voltage, $V_{WL}$, to the gate 76 and quantizing (e.g., categorizing) a resulting bit-line current, $I_{BIT}$. Each of the I-V traces depicted by FIG. 5 correspond to a different charge stored on the floating gate, $V_{FG}$, which should not be confused with the voltage that is applied to the gate, $V_{WL}$. The difference in floating gate 70 voltage, $V_{FG}$, between each I-V trace is an arbitrarily selected scaling factor "x." The illustrated I-V traces correspond to eight-different data values stored by the memory element 64, with a $V_{FG}$ of 0x representing a binary data value of 000, a $V_{FG}$ of 1x representing a binary data value of 001, and so on through $V_{FG}$ of 7x, which represents a binary data value of 111. Thus, by applying a voltage to the gate 76 and measuring the resulting bit-line current, the charge stored on the floating gate 78 may be sensed, and the stored data may be read.

The accuracy with which the bit-line current is quantized may affect the amount of data that a designer attempts to store in each memory element 64. For example, in a system with a low sensitivity, a single bit may be stored on each memory element 64. In such a system, a floating gate voltage $V_{FG}$ of 0x may represent a binary value of 0, and a floating gate voltage $V_{FG}$ of −7x may represent a binary value of one. Thus, the difference in floating gate voltages $V_{FG}$ corresponding to different data values may be relatively large, and the resulting differences and bit-line currents for different data values may also be relatively large. As a result, even low-sensitivity sensing circuitry may quantize (e.g., discern) these large differences in bit-line current during a read operation. In contrast, high-sensitivity sensing circuitry may facilitate storing more data in each memory element 64. For instance, if the sensing circuitry can distinguish between the eight different I-V traces depicted by FIG. 5, then the memory elements 64 may store three bits. That is, each of the eight different charges stored on the floating gate 78 may represent a different three-bit value: 000, 001, 010, 011, 100, 101, 110, or 111. Thus, circuitry that precisely quantizes the bit-line current $I_{BIT}$ may allow a designer to increase the amount of data stored in each memory element 64.

However, as mentioned above, a variety of effects may interfere with accurate measurement of the bit-line current. For instance, the position of the memory elements 64 along a bit-line may affect $R_{PD}$ and $R_{PS}$, which may affect the relationship between the word-line voltage $V_{WL}$ and the bit-line current $I_{BIT}$. To illustrate these effects, FIG. 6 depicts noise on the bit-line while reading from the memory element 64. As illustrated, noise in the bit-line current $I_{BIT}$ may cause the bit-line current $I_{BIT}$ to fluctuate. Occasionally, the fluctuation may be large enough to cause the bit-line current $I_{BIT}$ to reach a level that represents a different stored data value, which could cause the wrong value to be read from the memory elements 64. For instance, if the bit-line current is sensed at time 84, corresponding to an arbitrarily selected peak, a data value of 100 may be read rather than the correct data value of 011. Similarly, if the bit-line current is sensed at time 86, corresponding to an arbitrarily selected local minimum, a data value of 010 may be read rather than a data value of 011. Thus, noise on the bit-line may cause erroneous readings from memory elements 64.

Figure 7:
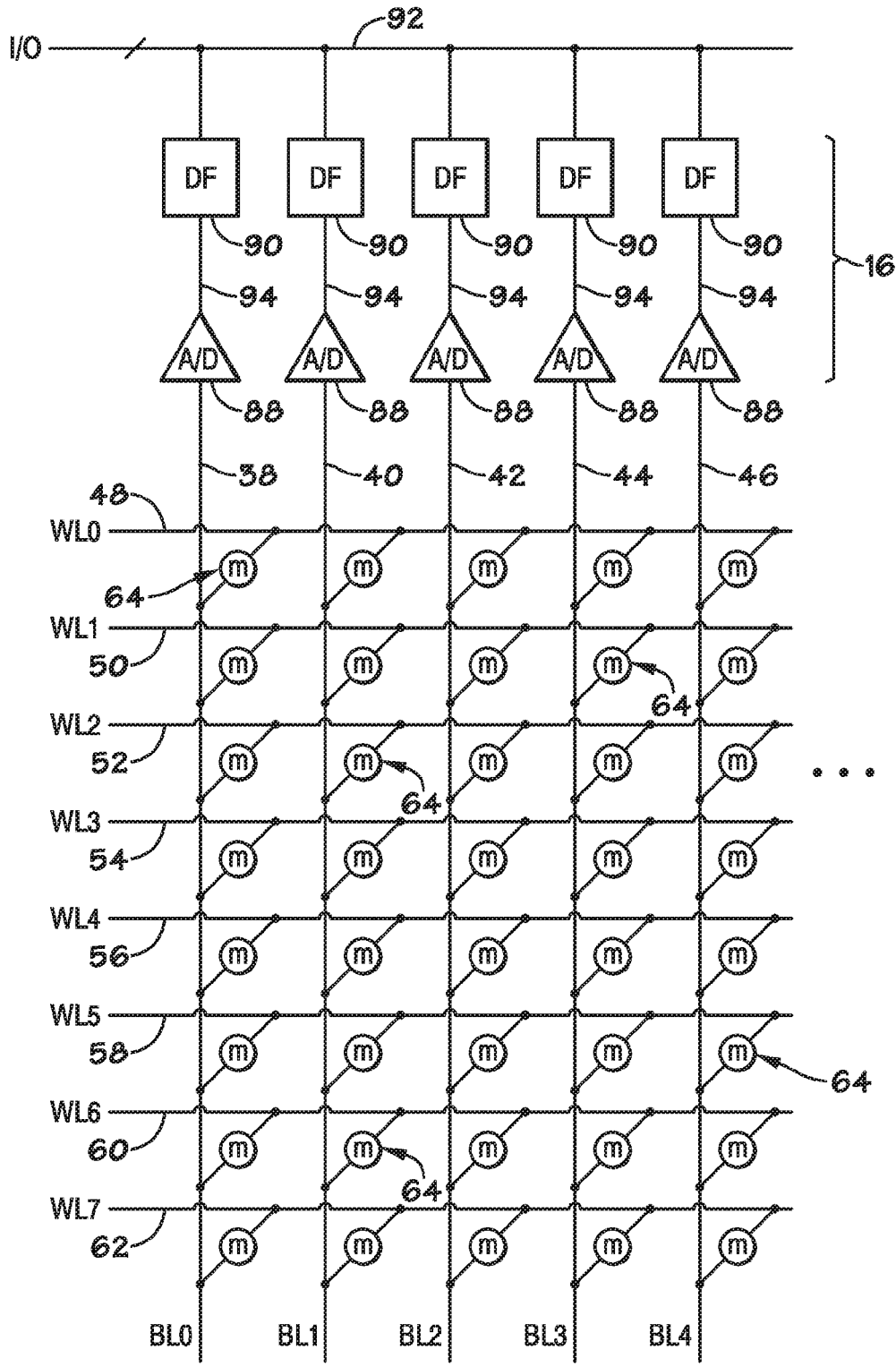
FIG. 7 illustrates a quantizing circuit in accordance with an embodiment of the invention.

FIG. 7 depicts a quantizing circuit 16 that may tend to reduce the likelihood of an erroneous reading. The illustrated quantizing circuit 16 includes an analog-to-digital converter 88 and a digital filter 90 connected to each of the bit-lines 38, 40, 42, 44, and 46, respectively. Each bit-line 38, 40, 42, 44, and 46 may connect to a different analog-to-digital converter 88 and digital filter 90. The digital filters 90, in turn, may connect to an input/output bus 92, which may connect to a column decoder 18, a column address latch 20, and/or control circuitry 28 (see FIG. 2).

In operation, the quantizing circuit 16 may quantize (e.g., digitize) analog signals from the memory elements 64 in a manner that is relatively robust to noise. As explained below, the quantizing circuit 16 may do this by converting the analog signals into a bit-stream and digitally filtering high-frequency components from the bit-stream.

The analog-to-digital converter 88 may be a one-bit, analog-to-digital converter or a multi-bit, analog-to-digital converter. In the present embodiment, an analog-to-digital converter 88 receives an analog signal from the memory element 64, e.g., a bit-line current $I_{BIT}$ or a bit-line voltage $V_{BL}$, and outputs a bit-stream that represents the analog signal. The bit-stream may be a one-bit, serial signal with a time-averaged value that generally represents the time-averaged value of the analog signal from the memory element 64. That is, the bit-stream may fluctuate between values of zero and one, but its average value, over a sufficiently large period of time, may be proportional to the average value of the analog signal from the memory element 64. In certain embodiments, the bit-stream from the analog-to-digital converter 88 may be a pulse-density modulated (PDM) version of the analog signal. The analog-to-digital converter 88 may transmit the bit-stream to the digital filter 90 on a bit-stream signal path 94.

The digital filter 90 may digitally filter high-frequency noise from the bit-stream. To this end, the digital filter 90 may be a low-pass filter, such as a counter, configured to average (e.g., integrate and divide by the sensing time) the bit-stream over a sensing time, i.e., the time period over which the memory element 64 is read. (Alternatively, in some embodiments, the digital filter 90 is configured to integrate the bit-stream without dividing by the sensing time.) As a result, the digital filter 90 may output a value that is representative of both the average value of the bit-stream and the average value of the analog signal from the memory element 64. In some embodiments, the digital filter 90 is a counter, and the cut-off frequency of the digital filter 90 may be selected by adjusting the duration of the sensing time. In the present embodiment, increasing the sensing time will lower the cutoff frequency. That is, the frequency response of the digital filter 90 may be modified by adjusting the period of time over which the bit-stream is integrated and/or averaged before outputting a final value. The frequency response of the digital filter 90 is described further below with reference to FIG. 15. For multi-bit memory elements 64, the output from the digital filter 90 may be a multi-bit binary signal, e.g., a digital word that is transmitted serially and/or in parallel.

Advantageously, in certain embodiments, the quantizing circuit 16 may facilitate the use of multi-bit memory elements 64. As described above, in traditional designs, the number of discrete data values that a memory element 64 stores may be limited by sense amps that react to noise. In contrast, the quantizing circuit 16 may be less susceptible to noise, and, as a result, the memory elements 64 may be configured to store additional data. Without the high frequency noise, the intervals between signals representative of different data values may be made smaller, and the number of data values stored by a given memory element 64 may be increased. Thus, beneficially, the quantizing circuit 16 may read memory elements 64 that store several bits of data, e.g., 2, 3, 4, 5, 6, 7, 8, or more bits per memory element 64.

Although the quantizing circuit 16 may sense the signal from the memory element 64 over a longer period of time than conventional designs, the overall speed of the memory device 12 may be improved. As compared to a conventional device, each read or write operation of the memory device 12 may transfer more bits of data into or out of the memory element 64. As a result, while each read or write operation may take longer, more data may be read or written during the operation, thereby improving overall performance. Further, in some memory devices 12, certain processes may be performed in parallel with a read or write operation, thereby further reducing the overall impact of the longer sensing time. For example, in some embodiments, the memory array 14 may be divided into banks that operate at least partially independently, so that, while data is being written or read from one bank, another bank can read or write data in parallel.

Figure 8:
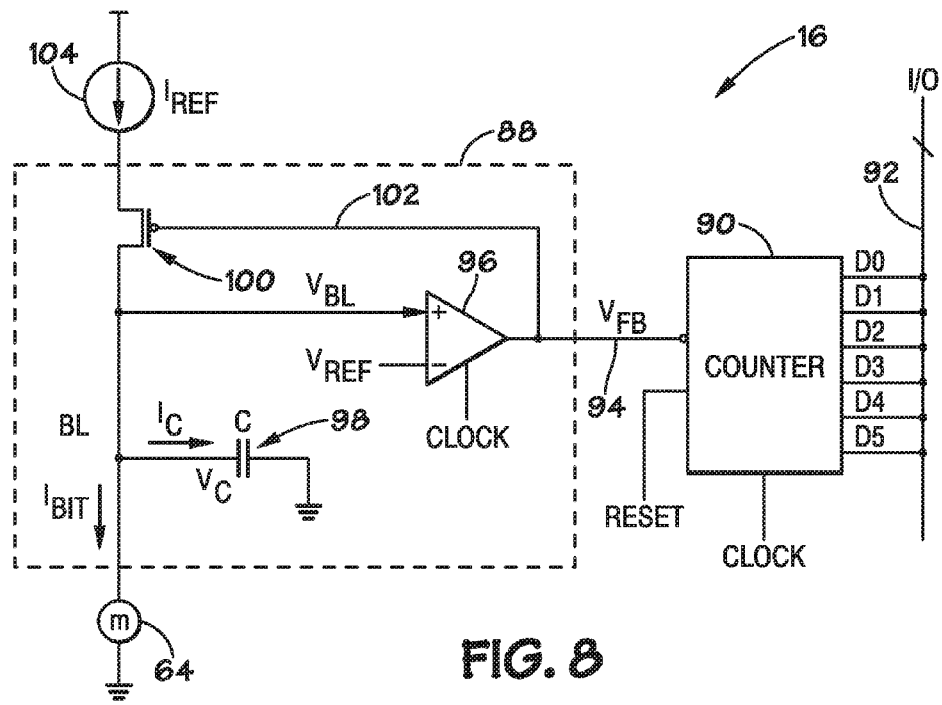
FIG. 8 illustrates a delta-sigma sensing circuit in accordance with an embodiment of the invention.

FIG. 8 illustrates details of one implementation of the quantizing circuit 16. In this embodiment, the digital filter 90 is a counter, and the analog-to-digital converter 88 is a first-order delta-sigma modulator. The illustrated delta-sigma modulator 88 may include a latched comparator 96, a capacitor 98, and a switch 100. In other embodiments, other types of digital filters and analog-to-digital converters may be employed, such as those described below in reference to FIG. 16.

As illustrated, an input of the counter 90 may connect to the bit-stream signal path 94, which may connect to an output of the comparator 96. The output of the comparator 96 may also connect to a gate of the switch 100 by a feedback signal path 102. The output terminal (e.g., source or drain) of the switch 100 may connect in series to one of the bit-lines 38, 40, 42, 44, or 46, and the input terminal of the switch 100 may connect to a reference current source 104 ($I_{REF}$). One plate of the capacitor 98 may connect to one of the bit-lines 38, 40, 42, 44, or 46, and the other plate of the capacitor 98 may connect to ground.

The illustrated counter 90 counts the number of clock cycles that the bit-stream 94 is at a logic high value or logic low value during the sensing time. The counter may count up or count down, depending on the embodiment. In some embodiments, the counter 90 may do both, counting up one for each clock cycle that the bit-stream has a logic high value and down one for each clock cycle that the bit-stream has a logic low value. Output terminals (D0-D5) of the counter 90 may connect to the input/output bus 92 for transmitting the count. The counter 90 may be configured to be reset to zero or some other value when a reset signal is asserted. In some embodiments, the counter 90 may be a series connection of D-flip-flops, e.g., D-flip-flops having SRAM or other memory for storing an initial value and/or values to be written to the memory element 64.

In the illustrated embodiment, the clocked comparator 96 compares a reference voltage ($V_{REF}$) to the voltage of one of the bit-lines 38, 40, 42, 44, or 46 ($V_{BL}$), which may be generally equal to the voltage of one plate of the capacitor 98. The comparator 96 may be clocked (e.g., falling and/or rising edge triggered), and the comparison may be performed at regular intervals based on the clock signal, e.g., once per clock cycle. Additionally, the comparator 96 may latch, i.e., continue to output, values ($V_{FB}$) between comparisons. Thus, when the clock signals the comparator 96 to perform a comparison, if $V_{BL}$ is less than $V_{REF}$, then the comparator 96 may latch its output to a logic low value, as described below in reference to FIG. 9. Conversely, if $V_{BL}$ is greater than $V_{REF}$, then the comparator 96 may latch a logic high value on its output, as described below in reference to FIG. 10. As a result, the illustrated comparator 96 outputs a bit-stream that indicates whether $V_{BL}$ is larger than $V_{REF}$, where the indication is updated once per clock cycle.

Advantageously, in some embodiments, the quantizing circuit 16 may include a single comparator (e.g., not more than one) for each column of multi-level memory elements 64. In contrast, conventional sense amplifiers often include multiple comparators to read from a multi-bit memory cell, thereby potentially increasing device complexity and cost.

The capacitor 98 may be formed by capacitive coupling of the bit-lines 38, 40, 42, 44, and 46. In other designs, this type of capacitance is referred to as parasitic capacitance because it often hinders the operation of the device. However, in this embodiment, the capacitor 98 may be used to integrate differences between currents on the bit-lines 38, 40, 42, 44, or 46 and the reference current to form the bit-stream, as explained further below. In some embodiments, the capacitor 98 may be supplemented or replaced with an integrated capacitor that provides greater capacitance than the "parasitic" bit-line capacitance.

Figure 9:
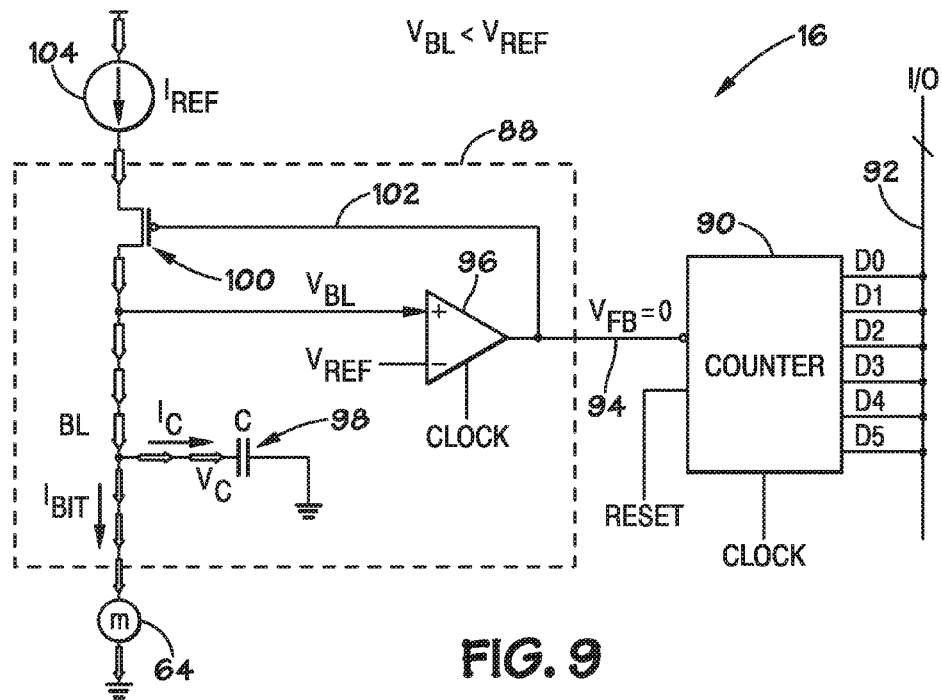
FIGS. 9 and 10 illustrate current flow during operation of the quantizing circuit of FIG. 8.
Figure 10:
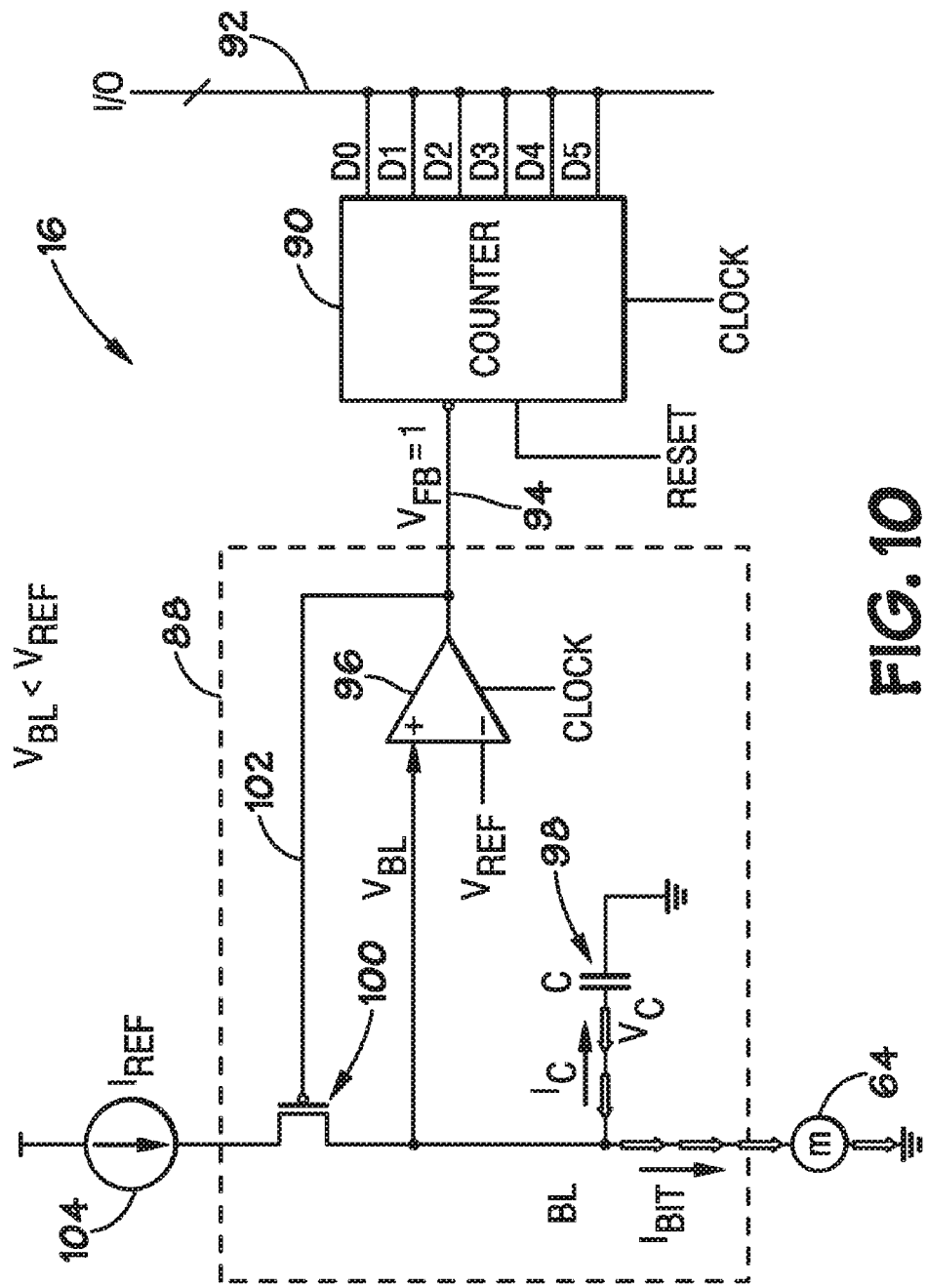

The illustrated switch 100 selectively transmits current $I_{REF}$ from the reference current source 104. In various embodiments, the switch 100 may be a PMOS transistor (as illustrated in FIGS. 8-10) or an NMOS transistor controlled by the $V_{FB}$ signal on the feedback signal path 102.

Figure 11:
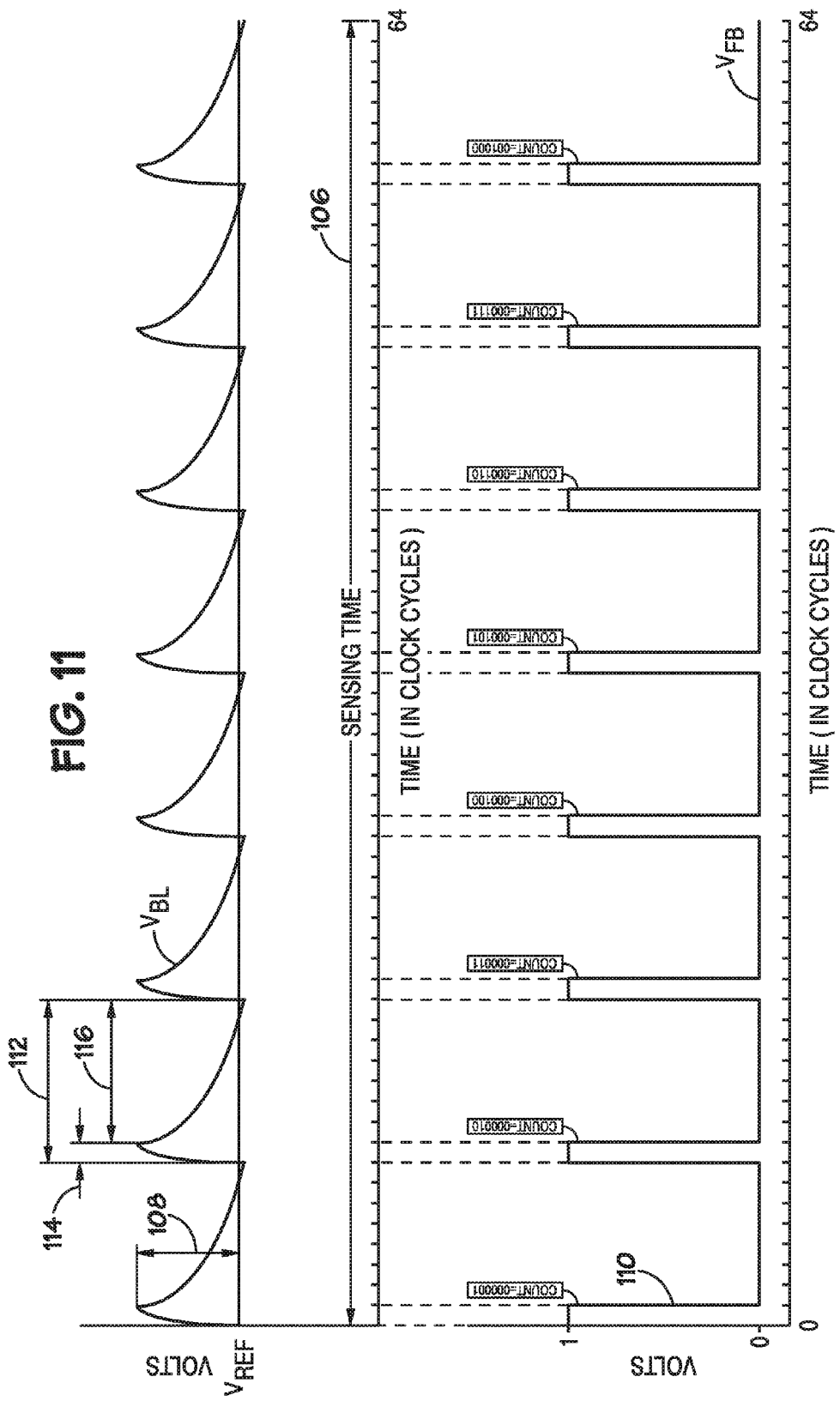
FIGS. 11-13 illustrate voltages in the quantizing circuit of FIG. 8 when sensing small, medium, and large currents, respectively.
Figure 12:
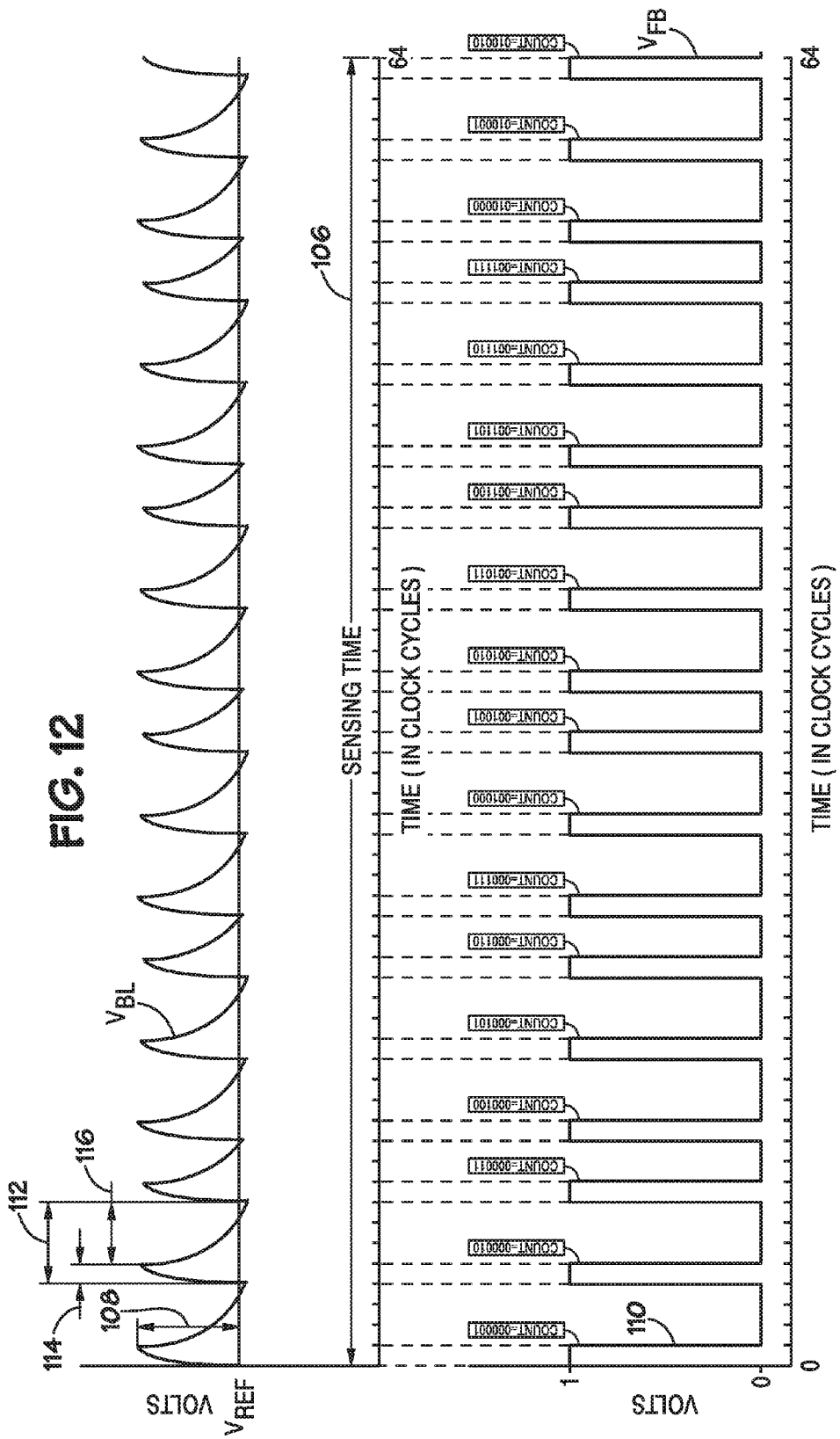
Figure 13:
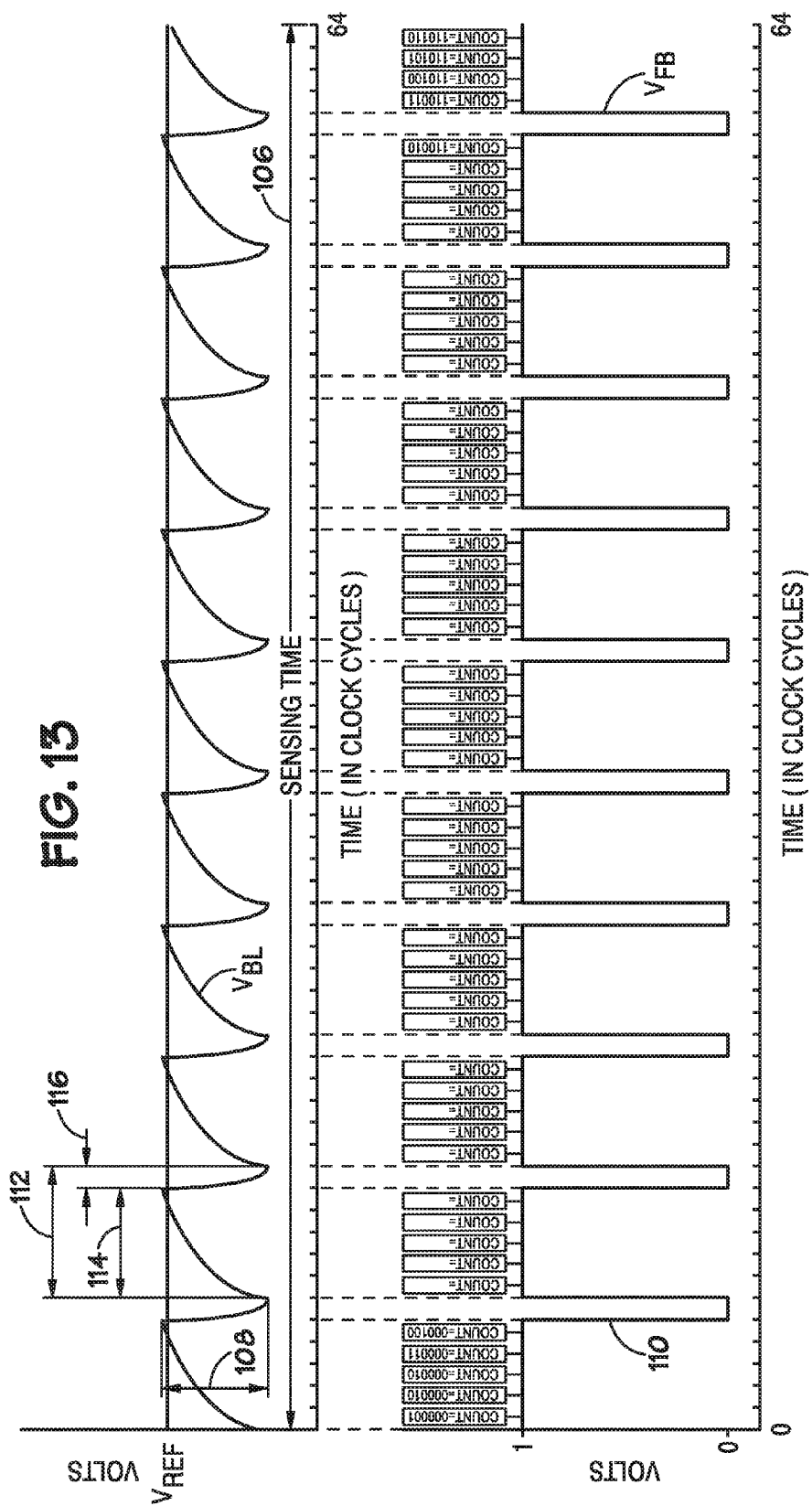

The operation of the quantizing circuit 16 will now be described with reference to FIGS. 9-12. Specifically, FIGS. 9 and 10 depict current flows in the quantizing circuit 16 when the comparator 96 is latched low and high, respectively. FIG. 11 illustrates $V_{BL}$, the bit-stream output from the comparator 96, and the corresponding increasing count 110 of the counter 90 for a relatively small bit-line current. FIG. 12 depicts the same voltages when measuring a medium sized bit-line current, and FIG. 13 depicts these voltages when measuring a relatively large bit-line current.

To sense the current through the memory element 64, the illustrated delta-sigma modulator 88 exploits transient effects to output a bit-stream representative of the bit-line current $I_{BIT}$. Specifically, the delta-sigma modulator 88 may repeatedly charge and discharge the capacitor 98 with a current divider that subtracts the bit-line current $I_{BIT}$ from the reference current $I_{REF}$. Consequently, a large current through the memory element 64 may rapidly discharge the capacitor 98, and a small current through the memory element 64 may slowly discharge the capacitor 98.

To charge and discharge the capacitor 98, the delta-sigma modulator 88 switches between two states: the state depicted by FIG. 9 (hereinafter "the charging state") and the state depicted by FIG. 10 (hereinafter "the discharging state"). Each time the delta-sigma modulator 88 transitions between these states, the bit-stream changes from a logic high value to a logic low value or vice versa. The proportion of time that the delta-sigma modulator 88 is in the state illustrated by either FIG. 9 or FIG. 10 may be proportional to the size of the bit-line current $I_{BIT}$ through the memory element 64. The larger the bit-line current $I_{BIT}$, the more time that the delta-sigma modulator 88 is in the state illustrated by FIG. 9, rather than the state illustrated by FIG. 10, and the more time that the bit-stream has a logic low value.

Starting with the charging state (FIG. 9), the capacitor 98 may initially accumulate a charge (e.g., become more charged). To this end, the output of the comparator 96 is latched to logic low, which, as mentioned above, may occur when $V_{BL}$ is less than $V_{REF}$. The logic low may be conveyed to switch 100 by the feedback signal path 102, and the switch 100 may close, thereby conducting the reference current $I_{REF}$ through one of the bit-lines 38, 40, 42, 44, or 46, as indicated by the larger arrows in FIG. 9. A portion of the electrons flowing through the reference current source 104 may be accumulated by the capacitor 98, as indicated by the smaller-horizontal arrows, and the remainder may be conducted through the memory element 64, i.e., the bit-line current $I_{BIT}$, as indicated by the smaller vertical arrows. Thus, the capacitor 98 may accumulate a charge, and $V_{BL}$ may increase.

The comparator 96 and the reference current source 104 may cooperate to charge the capacitor 98 for a discrete number of clock cycles. That is, when the delta-sigma modulator 88 transitions to the charging state, the delta-sigma modulator 88 may remain in this state for an integer number of clock cycles. In the illustrated embodiment, the comparator 96, the output of which is latched, changes state no more than once per clock cycle, so the switch 100, which is controlled by the output of the comparator 96, $V_{FB}$, conducts current for a discrete number of clock cycles. As a result, the reference current source 104 conducts current $I_{REF}$ through the bit-line and into the capacitor 98 for an integer number of clock cycles.

After each clock cycle of charging the capacitor 98, the delta-sigma modulator 88 may transition from the charging state to the discharging state, which is illustrated by FIG. 10, depending on the relative values of $V_{BL}$ and $V_{REF}$. Once per clock cycle (or at some other appropriate interval, such as twice per clock cycle), the comparator 96 may compare the voltage of the capacitor $V_{BL}$ to the reference voltage $V_{REF}$. If the capacitor 98 has been charged to the point that $V_{BL}$ is greater than $V_{REF}$, then the output of the comparator 96 may transition to logic high, as illustrated in FIG. 10. The logic high signal may be conveyed to the switch 100 by the feedback signal path 102, thereby opening the switch 100. As a result, the reference current source 104 may cease conducting current through the memory element 64 and into the capacitor 98, and the capacitor 98 may begin to discharge through the memory element 64.

In the present embodiment, the delta-sigma modulator 88 discharges the capacitor 98 for a discrete number of clock intervals. After each clock cycle of discharging the capacitor 98, the delta-sigma modulator 88 compares $V_{BL}$ to $V_{REF}$. If $V_{BL}$ is still greater than $V_{REF}$, then the comparator 96 may continue to output a logic high signal, i.e., $V_{FB}=1$, and the switch 100 remains open. On the other hand, if enough current has flowed out of the capacitor 98 that $V_{BL}$ is less than $V_{REF}$, then the comparator 96 may output a logic low signal, i.e., $V_{FB}=0$, and the switch 100 may close, thereby transitioning the delta-sigma modulator 88 back to the charging state and initiating a new cycle.

The counter 90 may count the number of clock cycles that the delta-sigma modulator 88 is in either the charging state or the discharging state by monitoring the bit-stream signal path 94. The bit-stream signal path 94 may transition back and forth between logic high and logic low with the output of the comparator 96, $V_{FB}$, and the counter 90 may increment and/or decrement a count once per clock cycle (or other appropriate interval) based on whether the bit-stream is logic high or logic low. After the sensing time has passed, the counter 90 may output a signal indicative of the count on output terminals D0-D5. As explained below, the count may correspond, e.g., proportionally, to the bit-line current, $I_{BIT}$.

FIGS. 11-13 illustrate voltages $V_{FB}$ and $V_{BL}$ in the quantizing circuit 16 when reading data from a memory element 64. Specifically, FIG. 11 illustrates a low-current case, in which the value stored by the memory element 64 is represented by a relatively low bit-line current. Similarly, FIG. 12 illustrates a medium-current case, and FIG. 13 illustrates a high-current case. In each of these figures, the ordinate of the lower trace represents the voltage of the bit-stream signal path 94, $V_{FB}$, and the ordinate of the upper trace illustrates the bit-line voltage, $V_{BL}$. The abscissa in each of the traces represents time, with the lower trace synchronized with the upper trace, and the duration of the time axes is one sensing time 106.

As illustrated by FIG. 11, the counter 90 is initially preset to zero (or some other appropriate value) by applying a reset signal. In some embodiments, the delta-sigma modulator 88 may undergo a number of start-up cycles to reach steady-state operation before initiating the sensing time and resetting the counter 90. At the beginning of the illustrated read operation, the delta-sigma modulator 88 is in the charging state, which charges the capacitor 98 and increases $V_{BL}$, as indicated by dimension arrow 108. At the beginning of the next clock cycle, the comparator 96 compares the bit-line voltage to the reference voltage and determines that the bit-line voltage is greater than the reference voltage. As a result, the bit-stream signal path 94 ($V_{FB}$) transitions to a logic high voltage, and the delta-sigma modulator 88 transitions to the discharging state. Additionally, the counter 90 increments the count 110 by one to account for one clock cycle of the bit-stream signal 94 holding a logic low value. Next, the charge stored on the capacitor 98 drains out through the memory element 64, and the bit-line voltage drops until the comparator 96 determines that $V_{BL}$ is less than $V_{REF}$, at which point the cycle repeats. The cycle has a period 112, which may be divided into a charging portion 114 and a discharging portion 116. Once during each cycle in the sensing time 106, the count 110 stored in the counter 90 may increase by one. At the end of the sensing time 106, the counter 90 may output the total count.

A comparison of FIG. 11 to FIGS. 12 and 13 illustrates why the count 110 correlates with the bit-line current. In FIG. 13, the high-current case, the stored charge drains from the capacitor 98 quickly, relative to the other cases, because the bit-line current $I_{BIT}$ is large and, as a result, the delta-sigma modulator 88 spends more time in the charging state than the discharging state. As a result, the bit-stream has a logic low value for a large portion of the sensing time 106, thereby increasing the count 110.

The capacitance of the capacitor 98 may be selected with both the clock frequency and the range of expected bit-line currents in mind. For example, the capacitor 98 may be large enough that the capacitor 98 does not fully discharge (e.g., saturate) when the bit-line current $I_{BIT}$ is either at its lowest expected value or at its highest expected value. That is, in some embodiments, the capacitor 98 generally remains in a transient state while reading the memory element 64. Similarly, the frequency at which the comparator 96 is clocked may affect the design of the capacitor 98. A relatively high frequency clock signal may leave the capacitor 98 with relatively little time to discharge or saturate between clock cycles, thereby leading a designer to choose a smaller capacitor 98.

Similarly, the size of the reference current may be selected with the range of expected bit-line currents in mind. Specifically, in certain embodiments, the reference current is less than the largest expected bit-line current $I_{BIT}$, so that, in the case of maximum bit-line current $I_{BIT}$, the capacitor 98 can draw charge from the reference current while the rest of the reference current flows through the memory element 64.

Figure 14:
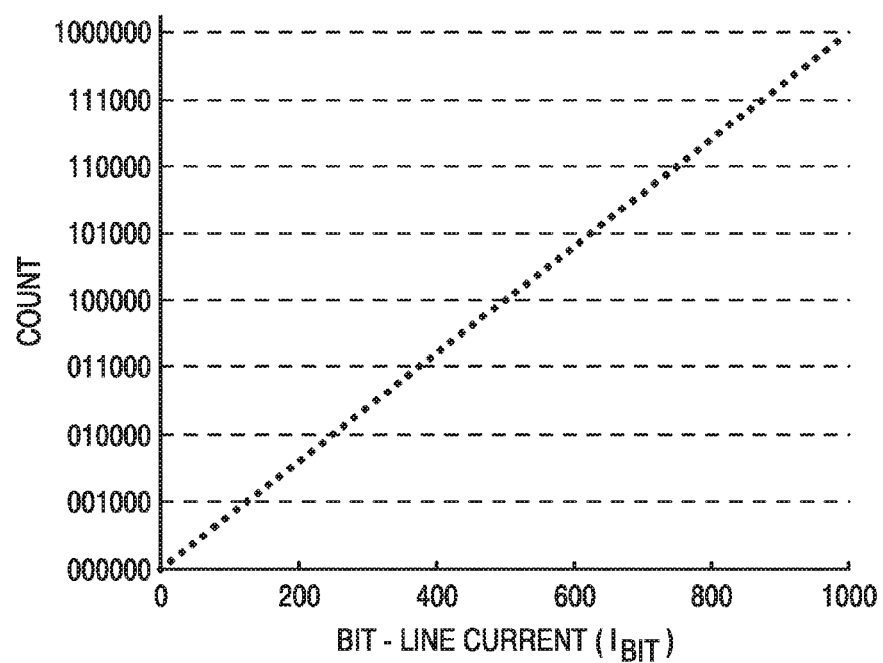
FIG. 14 is a graph of bit-line current versus counter output for the quantizing circuit of FIG. 8.

FIG. 14 illustrates the relationship between the bit-line current $I_{BIT}$ and the count for the presently discussed embodiment. As illustrated by FIG. 14, the count corresponds to (e.g., is generally proportional to) the bit-line current $I_{BIT}$. This relationship is described by the following equation (Equation 1), in which $N_{ST}$ represents the number of clock cycles during the sensing time:

$$I_{BIT}/I_{REF} = \text{Count}/N_{ST}$$

Thus, in the illustrated embodiment, the count corresponds to (e.g., is indicative of) the bit-line current $I_{BIT}$, which corresponds to the value stored by the memory element 64.

Advantageously, the quantizing circuit 16 may quantize (e.g., categorize) the bit-line current $I_{BIT}$ as falling into one of a large number of categories, each of which is represented by an increment of the count. In doing so, in some embodiments, the quantizing circuit 16 may resolve small differences in the bit-line current $I_{BIT}$. The resolution of the quantizing circuit 16 may be characterized by the following equation (Equation 2), in which $I_{MR}$ represents the smallest resolvable difference in bit-line current $I_{BIT}$, i.e., the resolution of the quantizing circuit 16:

$$I_{MR} = I_{REF}/N_{ST}$$

Thus, the resolution of the quantizing circuit 16 may be increased by increasing the sensing time or the clock frequency or by decreasing $I_{REF}$, which may limit the maximum cell current since $I_{MR}$ is less than $I_{REF}$.

The resolution of the quantizing circuit 16 may facilitate storing multiple bits in the memory element 64 or sensing multiple levels of light intensity in an image sensor element. For example, if the quantizing circuit 16 is configured to quantize (e.g., categorize) the bit-line current $I_{BIT}$ into one of four different levels, then the memory element 64 may store two-bits of data or, if the quantizing circuit 16 is configured to categorize the bit-line current $I_{BIT}$ into one of eight different current levels, then the memory element 64 may store three-bits of data. For the present embodiment, the number of bits stored by the memory element 64 may be characterized by the following equation (Equation 3), in which $N_B$ represents the number of bits stored by a memory element 64 and $I_{RANGE}$ represents the range of programmable bit-line currents through the memory element 64:

$$N_B = \log(I_{RANGE}/I_{MR})/\log 2$$

In short, in the present embodiment, greater resolution translates into higher density data storage for a given memory element 64.

Figure 15:
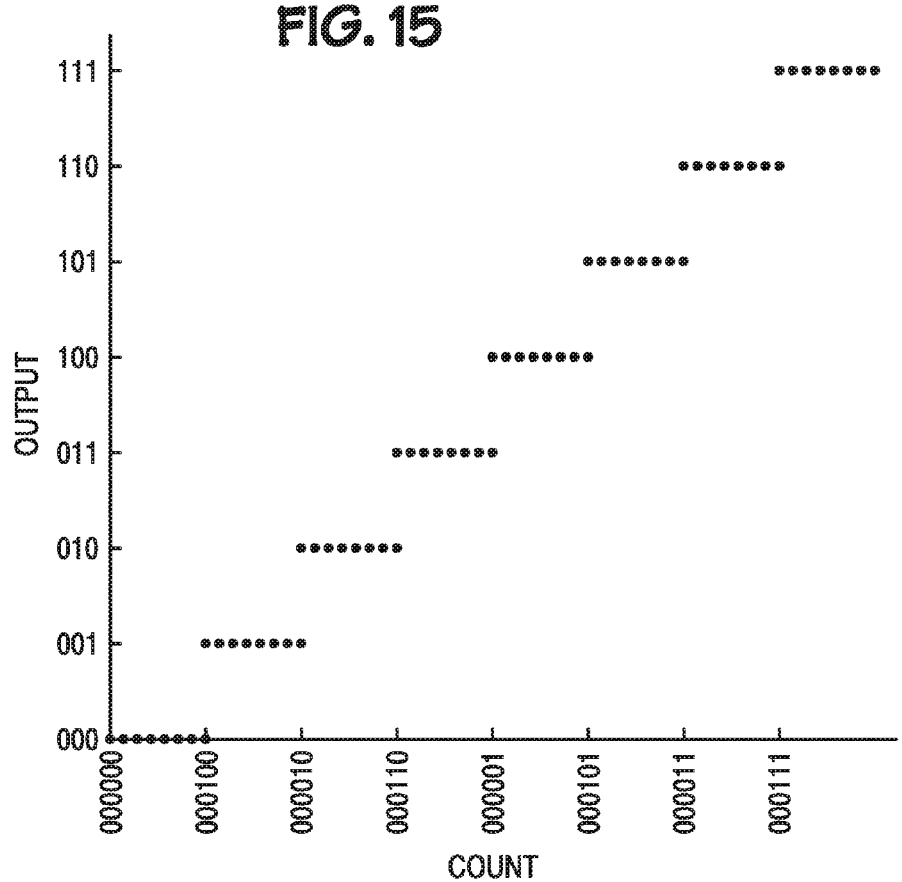
FIG. 15 is a graph of count versus quantizing circuit output in accordance with an embodiment of the invention.

FIG. 15 is a graph that illustrates one way in which the counter 90 may be configured to further reduce the effects of noise. In FIG. 15, the abscissa represents the count, and the ordinate represents the output of the quantizing circuit 16. In the present embodiment, the three-least-significant digits of the count are disregarded as potentially corrupted by noise. That is, D0-D2 (FIG. 8) either do not connect to the input/output bus 92 or are not interpreted as conveying data that is stored by the memory element 64. As a result, a range of counter values may represent a single data value stored by the memory element 64. For example, in the present embodiment, count values ranging from 00 1000 to 00 1111 are construed as representing a data value of 001. Representing data in this manner may further reduce the effects of noise because, even if noise affects the count, in many embodiments, it would have to affect the count in a consistent manner over a substantial portion of the sensing time to affect the more significant digits of the count. That is, disregarding less significant digits may lower the cutoff frequency of the counter 90. In other embodiments, fewer, more, or no digits may be truncated from the count as potentially representing noise.

Truncating less significant digits may introduce a rounding error, or a downward bias, in the output. This effect may be mitigated by presetting (e.g., driving latches to a particular state in advance of counting or storing a value in memory) the counter 90 in a manner that accounts for this bias. The counter 90 may be preset either before reading from the memory element 64 or before writing to the memory element 64. In some embodiments, the preset value may be one-half of the size of the range of counter values that represent a single output value. In other words, if m digits are truncated from the output, then the counter 90 may be preset to one-half of $2^m$ before reading from a memory element 64 or before writing to the memory element 64. In some embodiments, the memory in the counter 90 may store this preset value.

As mentioned above, the quantizing circuitry 16 may read multi-bit data locations 64 (FIG. 8). These data locations 64 may be time consuming to test relative to single-bit data locations because they store more data. During some forms of testing, data may be written to the data location 64 and, later, read from the data location 64. Moving this data into and out of a memory device may extend the duration of a test. In some embodiments with multi-bit data locations, this effect may be aggravated by a capacity to store a large amount of data and a desire to test a substantial portion, e.g., all, of that capacity.

This problem, however, may be mitigated by the memory device described below. In some embodiments, the memory device includes a built-in, self-test module that may reduce the amount of data transmitted to and from the memory device during testing. As described, the built-in, self-test module may output, and in some embodiments, generate, test data that is written to the data location and, subsequently, determine whether data read from the data locations corresponds to (e.g., matches, approximates, or shares a number of more-significant digits) the test data that was written to the data location 64.

Figure 16:
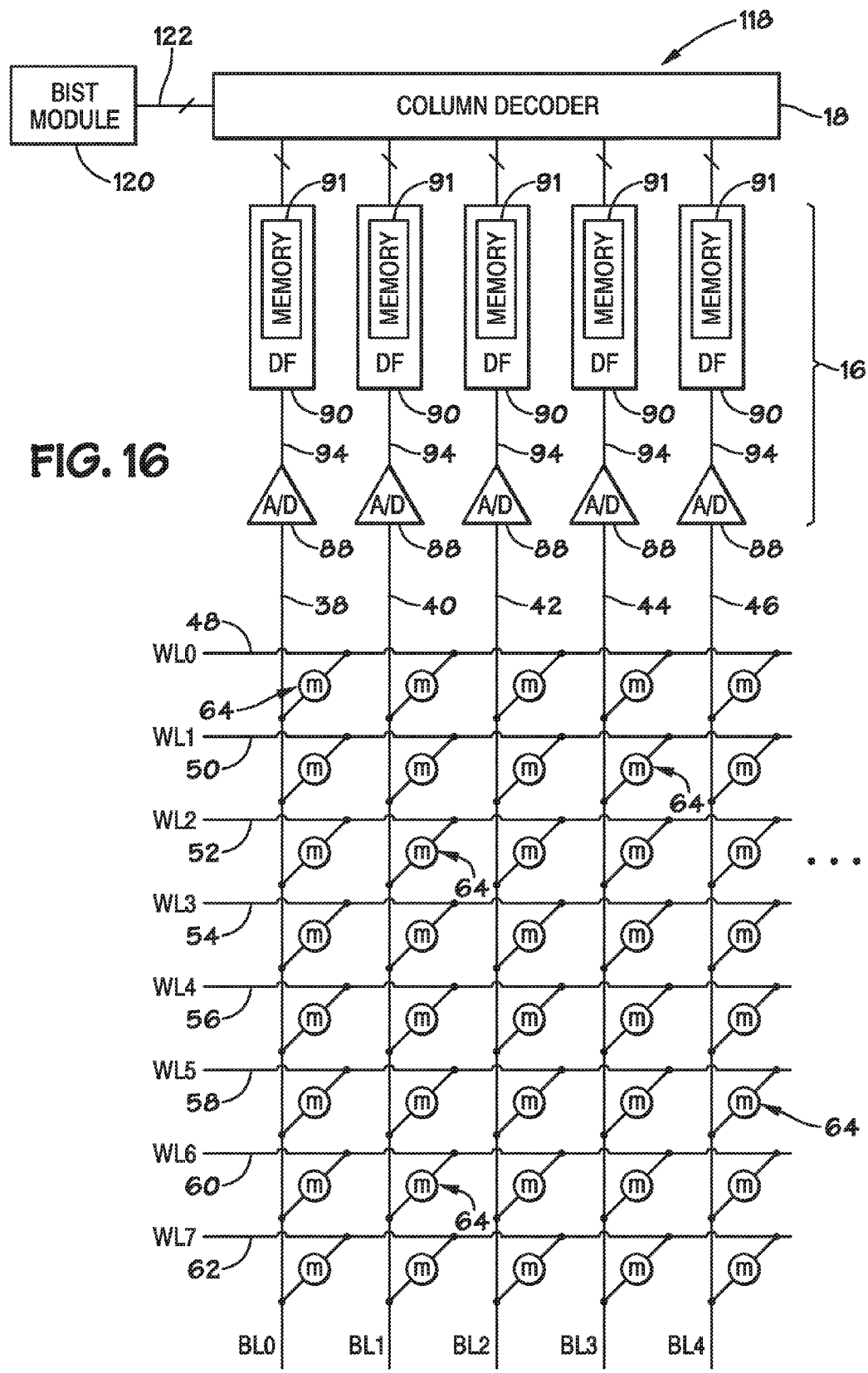
FIG. 16 illustrates a memory device with a built-in, self-test module in accordance with an embodiment of the invention.

FIG. 16 illustrates an example of a memory device 118 that includes an embodiment of a built-in, self-test module (BIST module) 120. The illustrated built-in, self-test module 120 may connect to several of the components of the previously described memory device shown in FIG. 7. In this embodiment, the built-in, self-test module 120 is connected via one or more lines 122 to the column decoder 18, which as described above, may be connected to the data locations 64 by the quantizing circuitry 16. The illustrated quantizing circuitry 16 includes an analog-to-digital converter 88 and a digital filter 90 with memory 91. In some embodiments, the analog-to-digital converter 88 may include a delta-sigma modulator, such as the delta-sigma modulator 88 of FIG. 8, and the digital filter 90 may include a counter, such as the counter 90 of FIG. 8.

The memory device 118 may be an integrated semiconductor device, which may include one or more of the following components on a single body (e.g., a single crystal or polycrystalline body) of a semiconducting material, such as silicon, gallium-arsenide, or indium phosphide: the built-in, self-test module 120; the column decoder 118; the quantizing circuitry 16; and the data locations 64. In other embodiments, one or more of these components may be on a different body and connected to the other components, for example in a multi-chip module or on a printed circuit board.

The built-in, self-test module 120 may be configured to test the data locations 64. To this end, in some embodiments, the built-in, self-test module 120 may generate, read, or receive the test data and provide it to the column decoder 18, which may provide (e.g., broadcast or route) the test data to one or more data locations 64. The built-in, self-test module 120 may provide the test data directly to the data location 64 or provide the test data to some other intermediate component. The test data may be written to the data location, and after the test data is written, the stored data, which may or may not correspond to the test data depending on whether the data location is functioning properly, may be read from the data location 64. The read data may then be transmitted to the built-in, self-test module 120, which receives the read data and determines whether it corresponds to the test data that was written to the data locations 64. If the test data and read data do not correspond, the built-in, self-test module 120 may identify the data location 64 from which the data was read as failing the test.

In the event that a data location 64 fails the test, the built-in, self-test module 120 may take a variety of actions, depending on the embodiment. For example, the built-in, self-test module 120 may store the address of the failing data location 64 in a lookup table on the memory device 118 or off the memory device 118. In some embodiments, the memory device 118 may be configured to not write data to addresses in such a lookup table. In another example, the built-in, self-test module 120 may be configured to transmit statistics about failing data locations, such as a total number of failing data locations 64, a percentage or ratio of failing data locations 64, or addresses of failing data locations 64, to a network, a memory controller, a quality control database, or external test equipment. In some embodiments, the built-in, self-test module 120 may be configured to respond to a failed test by blowing a fuse that disables the failing data location 64, e.g. by blowing a fuse connected to a wordline or a bit line or signaling other equipment that such a fuse should be blown. The built-in, self-test module 120 may also be configured to render redundant data locations 64 accessible, e.g., by blowing a fuse or signaling that such a fuse should be blown by other equipment.

Figure 17:
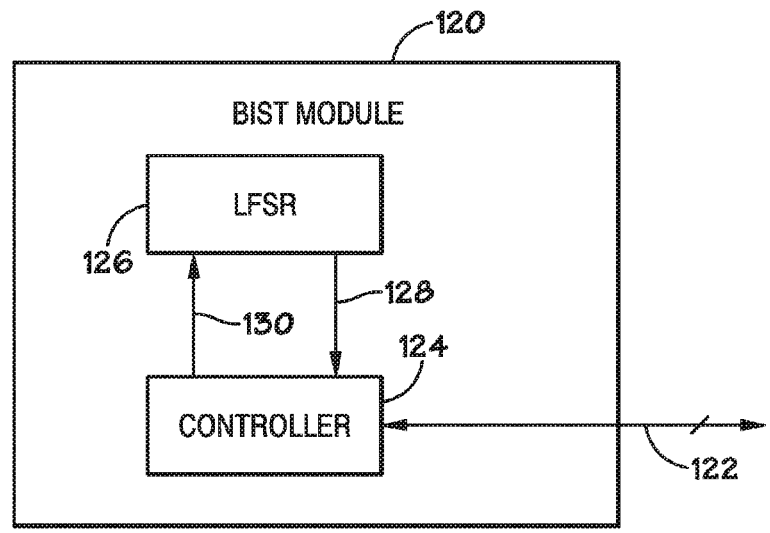
FIG. 17 illustrates details of the built-in, self-test module in the memory device of FIG. 16.

FIG. 17 illustrates details of the built-in, self-test module 120. In this embodiment, the built-in, self-test module 120 includes a controller 124 coupled to the one or more lines 122 and a linear-feedback shift register (LFSR) 126, which is described in further detail below with reference to FIG. 18. The illustrated linear-feedback shift register 126 includes a test-data output 128 and a reset signal input 130. As described further below, the linear-feedback shift register 126 may be configured to generate pseudo-random test data, e.g., a sequence or collection of data that approximates properties of random numbers but is substantially or completely determined by a relatively small set of initial values as compared to the sequence or collection of data. In some embodiments, n initial values may determine $2^n-1$ values in a sequence of test data, and the test data may include substantially all possible patterns of n bits, excluding the all zero pattern. The linear-feedback shift register 126 may be configured to provide this test data to the controller 124 via the test data output 128, and the controller 124 may be configured to either provide the test data to a data location 64 or compare this test data with data read from a data location 64, depending on the portion of a test being executed, as described further below with reference to FIG. 19.

Figure 18:
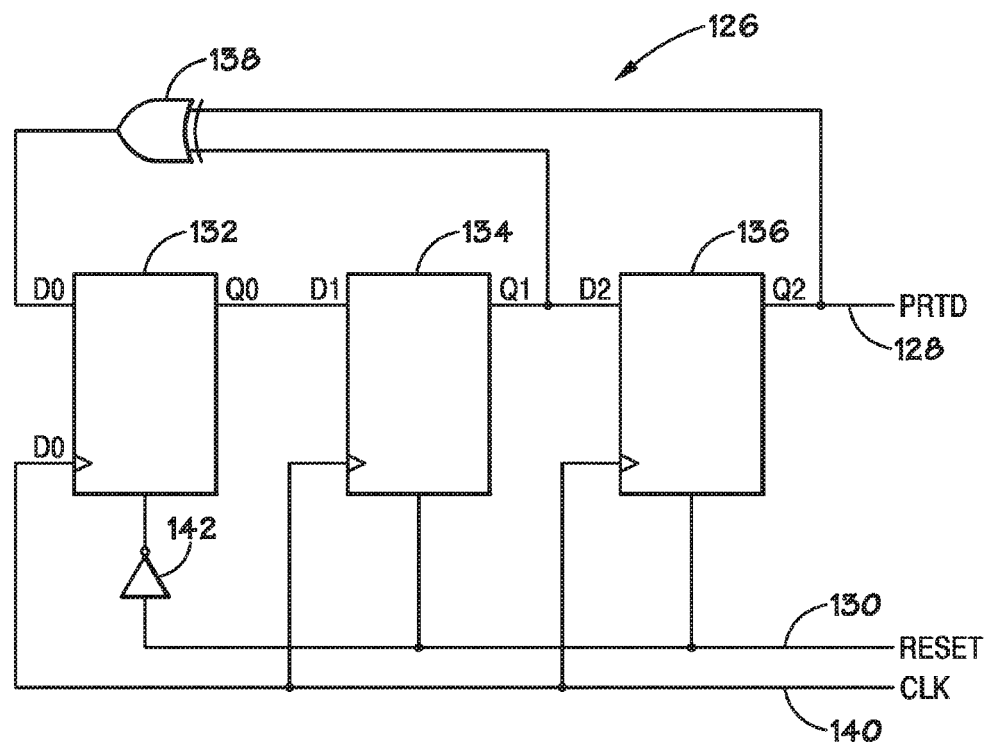
FIG. 18 illustrates a linear-feedback shift register in the built-in, self-test module of FIG. 17.

FIG. 18 illustrates an embodiment of the linear-feedback shift register 126 in greater detail. The linear-feedback shift register 126 may include flip-flops 132, 134, and 136, and an XOR gate 138. Other embodiments may include more than three flip-flops and more than one XOR gate. The illustrated flip-flops 132, 134, and 136 may be DQ flip-flops connected in series, with a D input of each flip-flop connected to a Q output of the adjacent flip-flop. The inputs of the XOR gate 138 may be connected to both the Q1 output of the flip-flop 134 and the Q2 output of the flip-flop 136, and the output of the XOR gate 138 may be connected to the D0 input of the flip-flop 132. The flip-flops 132, 134, and 136 may also be connected to a clock signal (CLK) 140 and the reset signal (RESET) 130 (FIG. 17). In the illustrated embodiment, the flip-flop 132 is connected to the reset signal 130 via an inverter 142, but in other embodiments, one or more of the other flip-flops 134 and 136 may be connected to the reset signal 130 via an inverter. In still other embodiments, none of the flip-flops 134, 136, and 138 may be connected to the reset signal 130 via an inverter, and the reset signal 130 may be configured to reset the Q outputs to one rather than zero.

The reset signal 130 may reset the linear-feedback shift register 126. When the illustrated linear-feedback shift register 126 is reset, the Q0 output of the flip-flop 132 is set to one, the Q1 output of the flip-flop 134 is set to zero, and the Q2 output of the flip-flop 136 is set to zero. In other embodiments, the flip-flops 132, 134, and 136 may be reset to other values.

The linear-feedback shift register 126 may sequentially generate pseudo-random test data in sympathy with, e.g., in sync with, as might occur once per clock cycle, the clock signal 140. Once per clock cycle, the flip-flops 132, 134, and 136 may latch their D input to their Q output by sensing the value received at their respective D inputs and persistently providing a corresponding (e.g., matching or complementary) value on their respective Q outputs. The XOR gate 138 may provide an XOR of the Q outputs of the flip-flops 134 and 136 to the D input of the flip-flop 132. The Q2 output of the flip-flop 136 may provide the pseudo-random test data. The operation of the linear-feedback shift register 126 is described by the following table (Table 1):

| RESET | CLK cycles | Q0 | Q1 | Q2 |
|---|---|---|---|---|
| 1 | 0 | 0 | 1 | 1 |
| 0 | 1 | 0 | 0 | 1 |
| 0 | 2 | 1 | 0 | 0 |
| 0 | 3 | 0 | 1 | 0 |
| 0 | 4 | 1 | 0 | 1 |
| 0 | 5 | 1 | 1 | 0 |
| 0 | 6 | 1 | 1 | 1 |
| 0 | 7 | 0 | 1 | 1 |
| 0 | 8 | 0 | 0 | 1 |
| 1 | 9 | 0 | 1 | 1 |

As illustrated by Table 1, the pseudo-random test data (PRTD) provided from Q2 repeats at clock cycle number 7, and the reset signal at clock cycle number 9 resets the linear-feedback shift register 126 to a reset state, corresponding to Q0=0, Q1=1, and Q2=1. Other reset states may be selected in other designs, and embodiments with more flip-flops may have a longer period than eight clock cycles before they repeat.

In the illustrated embodiment, the pseudo-random test data is provided from the Q2 output of the flip-flop 136, but in other embodiments, the pseudo-random test data 128 may be provided from the Q outputs of the other flip-flops 132 or 134 or one of the D inputs. In some embodiments, the pseudo-random test data in 128 may be provided from multiple Q outputs or D inputs of the flip-flops 132, 134, and 136 in parallel, e.g., through a 3-bit wide bus connected to the Q output of all of the flip-flops 132, 134, and 136.

The pseudo-random test data provided from the linear-feedback shift register 126 may be deterministic, i.e., knowing initial values of the pseudo-random test data, the subsequent values in the sequence can be calculated. As a corollary to this, in some embodiments, if a current state of the linear-feedback shift register 126 is known, a subsequent state of the linear-feedback shift register 126 can be calculated. It follows then that, when the illustrated linear-feedback shift register 126 is reset, it may subsequently provide substantially the same sequence of pseudo-random test data. As described below, the deterministic behavior of the linear-feedback shift register 126 can be used to identify data locations 64 that fail to store data, e.g., data locations in which the data read from the data location does not correspond to the data written to the data location.

Figure 19:
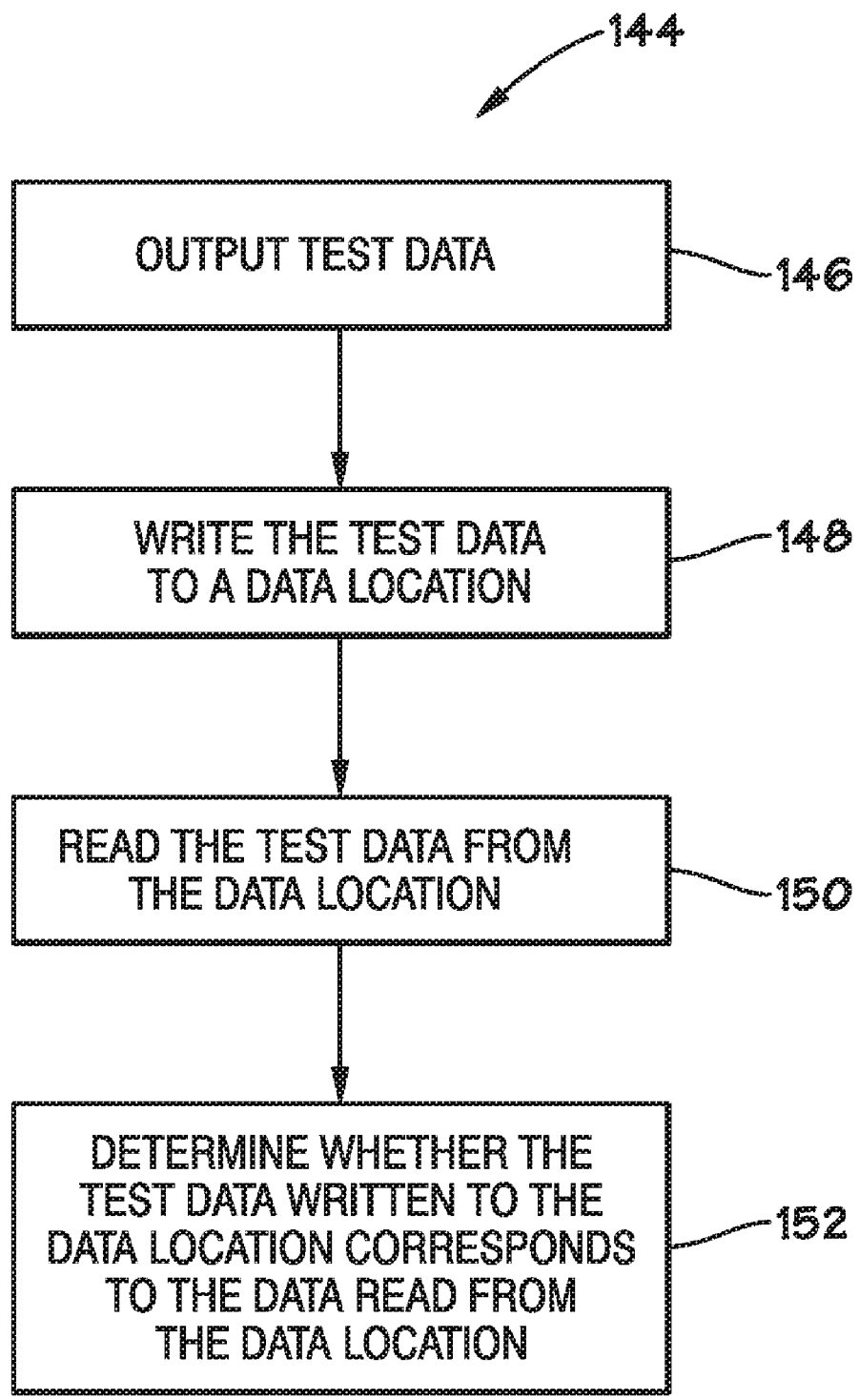
FIG. 19 illustrates an example of a self-test process, which may be executed by the memory device of FIG. 16.

FIG. 19 illustrates an example of a test process 144, which may be executed by certain embodiments of the built-in, self-test module 120 (FIG. 16). The illustrated process 144 begins with providing test data, as illustrated by block 146. Providing test data may include generating test data with, for example, a linear-feedback shift register 126 (FIG. 16), or it may include receiving test data from some other device, such as automated test equipment, or reading test data from internal or external memory. The test data may be digital, e.g., binary, and it may include a sequence of the same value repeated or a sequence of values that vary, e.g., in a linear, cyclical, exponential, polynomial, random, or pseudo-random fashion. In some embodiments, the test data may include a sequence of values that vary in a deterministic fashion such that the test data can be re-generated with a set of initial values.

After providing the test data, the test data may be written to a data location, as illustrated by block 148 (FIG. 19). Writing the test data to a data location may include incrementally adjusting a parameter of the data location and reading the data location until the parameter of the data location corresponds to the test data. Depending on the type of data location, different parameters may be adjusted, such as a charge on a floating gate, a magnetic state, or a degree of crystallinity of a phase-change memory element. After the parameter of the data location is adjusted by an increment, the quantizing circuit 16 may read the data location and determine whether the read data corresponds to the test data. To this end, in some embodiments, the test data may be stored temporarily in memory 91 (FIG. 16), such as SRAM, in the quantizing circuit 16, and the quantizing circuit 16 may read the data location 64. If the test data does not correspond to the data read from the data location 64, the parameter of the data location 64 may be adjusted by another increment, and the quantizing circuit 16 may read the data location again after the parameter is adjusted. The cycle of adjusting and reading may be repeated until the data read from the data location 64 corresponds to the test data in memory 91. If, after a number of cycles, the data read from the data location 64 does not correspond to the test data in memory 91, the data location 64 may be designated as failing to receive data.

In certain embodiments, a plurality of data locations may be written to before proceeding to the next step. For example, a data word may be written generally simultaneously to a plurality of data locations connected to a word line or a bit line. In some embodiments, an entire row, column, block, or memory device may be written to before proceeding.

After writing the test data, the data location may be stressed. Stressing the data location might include measuring the likelihood of a data location failing under a worst-case scenario, such as high temperatures, large mechanical stresses, or combinations thereof. The data location may be left to store the test data for a period of time, and during this period, the data location may be exposed to elevated temperatures, e.g., more than 100 degrees above room temperature, mechanical stresses, electromagnetic radiation, or other forms of energy, such as cosmic rays. Or, in some embodiments, the data location may not be stressed during testing.

Next in the process 144, the test data may be read from the data location 64, as illustrated by block 150 (FIG. 19). Reading the test data may include reading the test data with a quantizing circuit, such as the quantizing circuits 16 illustrated by FIG. 8 or 16. In some embodiments, reading may include truncating a portion of a count produced by a counter 90 coupled to a delta sigma modulator 88, as illustrated by FIG. 15. The read data may be provided to the built-in, self-test module 120.

Next, in the present embodiment, it is determined whether the test data written to the data location corresponds to the data read from the data location, as illustrated by block 152. This step may be executed, for example, by the controller 124 in the built-in, self-test module 120 (FIG. 17) or external automated test equipment. To determine whether the data corresponds, the controller 124 may provide a signal that directs some other component, such as the linear-feedback shift register 126, to generate the test data again. Generating the test data again may include resetting the linear-feedback shift register 126 by providing a reset signal 130. The controller 124 may receive pseudo-random test data from the linear-feedback shift register 126, which corresponds to the pseudo-random test data that was previously written, and compare this pseudo-random test data to the data that was read from the data location. If the test data is deterministic, the linear-feedback shift register 126 may provide generally the same sequence of test data as was initially written to the data location. The controller 124 may compare the re-generated test data to the read data and determine whether they correspond, e.g., whether they are the same or whether a certain number of more-significant digits are the same.

In some embodiments, parameters of the memory device 118 may be adjusted in response to the determination in the step illustrated by block 152. For example, data locations 64 may be disabled by, for example, blowing a fuse, or redundant data locations 64 may be enabled, for example by blowing and fuse connected to redundant data locations. In some embodiments, the result of the determination in block 152 may be used to categorize the memory device 118 into one of a variety of categories, such as a failing device; a lower performance device; a higher performance device; a device having certain voltage, power, or speed characteristics; or a device capable of storing some amount of data.

The test process 144 may be repeated after varying certain conditions in the memory device 118. For instance, the size of the increment by which a data location's parameter is adjusted may be decreased or increased between instances of performing the test process 144. In some embodiments, a reference voltage of a delta-sigma modulator may be increased or decreased between instances of performing the test process 144, or a number of bits truncated by a counter may be increased or decreased, or a duration of a sensing time may be increased or decreased. Certain embodiments may attempt to recover failing data locations by increasing the number of bits truncated, increasing the sensing time, or decreasing the increment by which a data location's parameter is adjusted.

In some embodiments, an error-detection module or an error-correction module may be connected to the built-in, self-test module 120 and the data location 64. Such embodiments may encode the test data, and other data, with redundant data that is indicative of the data being written and examine read data for internal consistency between the redundant data and the data that was written. Examples of encoding include a Hamming code or a parity bit.

Figure 20:
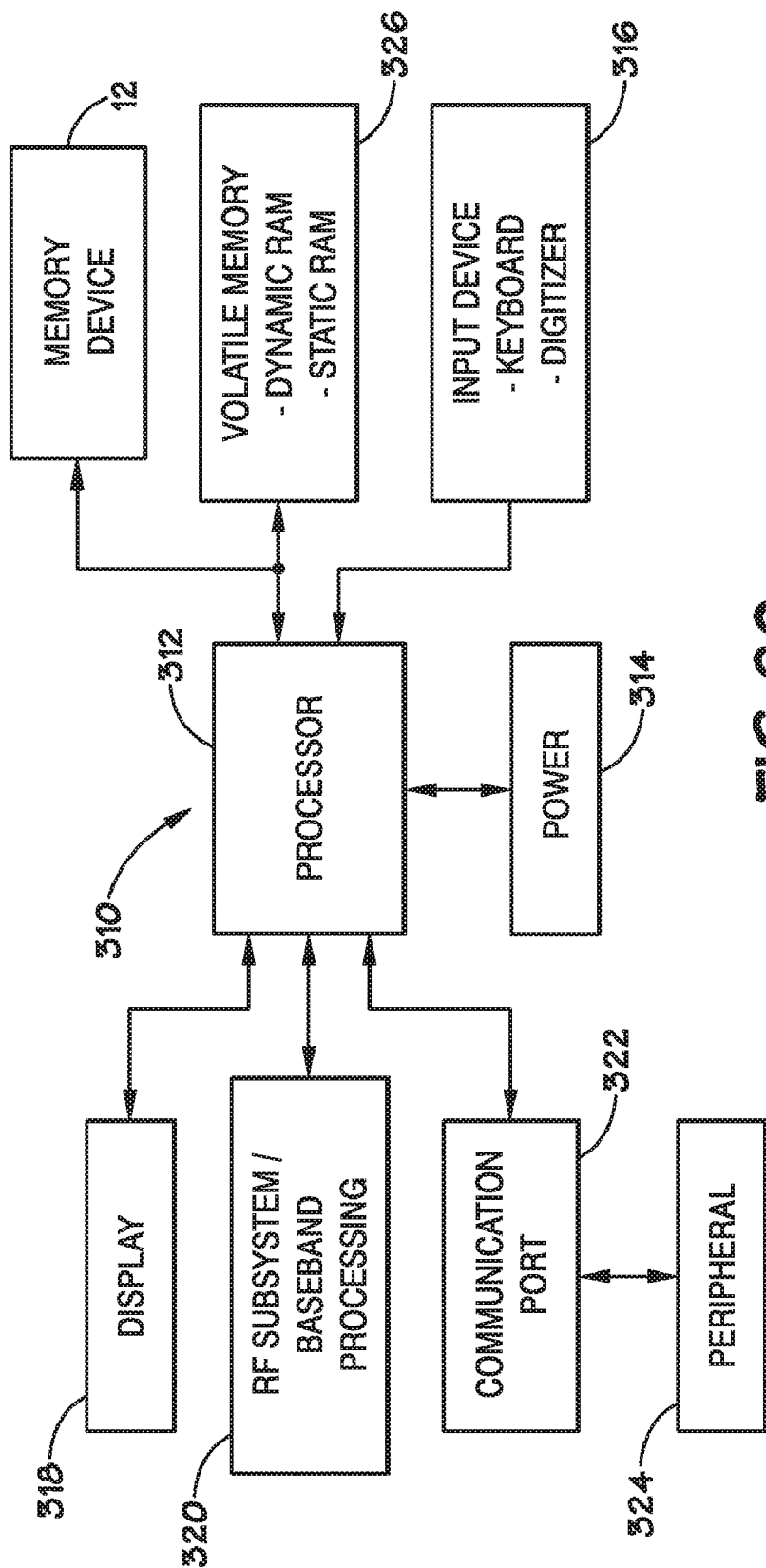
FIG. 20 illustrates an example of a system including the memory devices of FIGS. 2 and 16.

FIG. 20 depicts an example of a processor-based system 310 that includes the memory device 12 (FIG. 2) or the memory device 118 (FIG. 16). Alternatively or additionally, the system 310 may include the imaging device 13. The system 310 may be any of a variety of types such as a computer, pager, cellular phone, personal organizer, control circuit, etc. In a typical processor-based system, one or more processors 312, such as a microprocessor, control the processing of system functions and requests in the system 310. The processor 312 and other subcomponents of the system 310 may include quantizing circuits, such as those discussed above.

The system 310 typically includes a power supply 314. For instance, if the system 310 is a portable system, the power supply 314 may advantageously include a fuel cell, permanent batteries, replaceable batteries, and/or rechargeable batteries. The power supply 314 may also include an AC adapter, so the system 310 may be plugged into a wall outlet, for instance. The power supply 314 may also include a DC adapter such that the system 310 may be plugged into a vehicle cigarette lighter, for instance.

Various other devices may be connected to the processor 312 depending on the functions that the system 310 performs. For instance, a user interface 316 may be connected to the processor 312. The user interface 316 may include buttons, switches, a keyboard, a light pen, a mouse, a digitizer and stylus, and/or a voice recognition system, for instance. A display 318 may also be connected to the processor 312. The display 318 may include an LCD, an SED display, a CRT display, a DLP display, a plasma display, an OLED display, LEDs, and/or an audio display, for example. Furthermore, an RF sub-system/baseband processor 320 may also be connected to the processor 312. The RF sub-system/baseband processor 320 may include an antenna that is connected to an RF receiver and to an RF transmitter (not shown). One or more communication ports 322 may also be connected to the processor 312. The communication port 322 may be adapted to be connected to one or more peripheral devices 324 such as a modem, a printer, a computer, or to a network, such as a local area network, remote area network, intranet, or the Internet, for instance.

The processor 312 generally controls the system 310 by implementing software programs stored in the memory. The memory is operably connected to the processor 312 to store and facilitate execution of various programs. For instance, the processor 312 may be connected to the volatile memory 326 which may include Dynamic Random Access Memory (DRAM) and/or Static Random Access Memory (SRAM). The volatile memory 326 is typically large so that it can store dynamically loaded applications and data. As described further below, the volatile memory 326 may be configured in accordance with embodiments of the present invention.

The processor 312 may also be connected to the memory device 12. The memory device 12 may include a read-only memory (ROM), such as an EPROM, and/or flash memory to be used in conjunction with the volatile memory 326. The size of the ROM is typically selected to be just large enough to store any necessary operating system, application programs, and fixed data.

The memory device 10 and volatile memory 326 may store various types of software, such as an operating system or office productivity suite including a word processing application, a spreadsheet application, an email application, and/or a database application. These programs may be stored on a variety of tangible machine readable mediums.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device, comprising:
 a data location comprising a multi-bit data location;
 a quantizing circuit coupled to the data location; and
 a test module coupled to the quantizing circuit, wherein the test module is configured to test the data location by incrementally adjusting a parameter of the data location until the content of the data location corresponds to test data of the test module; and
 wherein the quantizing circuit comprises:
  an analog-to-digital converter;
  a switch coupled to the data location; and
  a feedback signal path coupled to the output of the analog-to-digital converter and to the switch.

2. The device of claim 1, wherein the data location comprises a floating gate transistor or a phase-change memory element.

3. The device of claim 1, wherein the quantizing circuit comprises a digital filter.

4. The device of claim 3, wherein the digital filter comprises a counter.

5. The device of claim 1, wherein the analog-to-digital converter comprises a delta-sigma modulator.

6. The device of claim 1, wherein the test module comprises a built-in, self-test module.

7. The device of claim 6, wherein the built-in, self-test module comprises:
 a controller; and
 a linear-feedback shift register.

8. The device of claim 7, wherein the linear-feedback shift register comprises:
 a plurality of flip-flops coupled to one another; and
 an XOR gate having an output coupled to an input of a flip-flop of the plurality of flip-flops.

9. The device of claim 8, wherein the XOR gate comprises two inputs that are each coupled to outputs of another two flip-flops of the plurality of flip-flops.

10. A system, comprising:
 a memory device comprising:
  a plurality of data locations comprising a plurality of multi-bit data locations;
  a delta-sigma modulator coupled to the plurality of data locations;
  a switch coupled to the plurality of data locations;
  a feedback signal path coupled to the output of the delta-sigma modulator and to the switch;
  a counter coupled to the delta-sigma modulator; and
  a built-in, self-test module coupled to the plurality of data locations, wherein the built-in, self-test module is configured to test the plurality of data locations by incrementally adjusting a parameter of one of the plurality of data locations until the content of the one of the plurality of data locations corresponds to test data of the built-in, self-test module.

11. The system of claim 10, wherein the plurality of data locations each comprise flash memory, phase-change memory, or magneto-resistive memory.

12. The system of claim 10, wherein the delta-sigma modulator comprises a comparator with an input coupled to the plurality of data locations and an output coupled to the counter.

13. The system of claim 10, wherein the counter comprises memory.

14. The system of claim 10, wherein the built-in, self-test module comprises a linear-feedback shift register.

15. The system of claim 14, wherein the linear-feedback shift register comprises three or more DQ flip-flops coupled to one another in series.

16. The system of claim 10, wherein the built-in, self-test module comprises a controller configured to provide test data to the plurality of data locations, receive data read from the plurality of data locations, and compare the test data to the data read from the plurality of data locations.

17. The system of claim 16, wherein the controller is configured to designate a data location from among the plurality of data locations as failing to store data during a test.

18. A method, comprising:
writing test data to a data location;
reading the test data from the data location with a quantizing circuit, wherein reading comprises truncating a count; and
determining whether the test data written to the data location corresponds to the test data.

19. The method of claim 18, comprising generating the test data.

20. The method of claim 19, wherein generating the test data comprises generating pseudo-random test data.

21. The method of claim 19, wherein generating the test data comprises resetting a linear-feedback shift register and providing data from the linear-feedback shift register.

22. The method of claim 19, wherein generating the test data comprises providing the test data from a built-in, self-test module.

23. The method of claim 18, wherein writing the test data comprises:
storing the test data in memory;
adjusting a parameter of a data location by an increment;
reading the data location;
comparing data read from the data location to the test data; and
if the data read from the data location does not correspond to the test data, then adjusting the parameter by another increment.

24. The method of claim 18, wherein reading the test data comprises sensing a charge on a floating gate or sensing a resistance of a resistive memory element.

25. The method of claim 18, wherein determining comprises determining whether the test data is the same as the data read from the data location.

26. The method of claim 18, further comprising generating the test data before writing the test data to the data location and generating the test data a second time after writing the test data to the data location.

27. The method of claim 18, further comprising resetting a linear-feedback shift register.

28. The method of claim 18, comprising stressing the data location.

29. A method, comprising:
writing test data to a data location;
reading the test data from the data location with a quantizing circuit; and
determining whether the test data written to the data location corresponds to the test data; and
adjusting one or more of a number of bits truncated and a sensing time duration in response to the determination.

30. A device, comprising:
a test circuit;
a memory element coupled to the test circuit, wherein the memory element comprises a multi-bit data location, wherein the test circuit is configured to test the memory element by incrementally adjusting a parameter of one of the memory element until the content of the memory element corresponds to test data of the test circuit; and
a quantizing circuit coupled to the memory element, wherein the quantizing circuit comprises:
an analog-to-digital converter;
a switch coupled to the memory element; and
a feedback signal path coupled to the output of the analog-to-digital converter and to the switch.

31. The device of claim 30, wherein the test circuit comprises a linear-feedback shift register.

32. The device of claim 30, wherein the test circuit is disposed on a common silicon substrate with the memory element and the quantizing circuit.

33. The device of claim 30, wherein the test circuit is configured to deterministically generate data.

* * * * *